US012721000B2

(12) United States Patent
Zhang et al.

(10) Patent No.: US 12,721,000 B2
(45) Date of Patent: Aug. 25, 2026

(54) DISPLAY SUBSTRATE AND PREPARATION METHOD THEREFOR

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Dacheng Zhang, Beijing (CN); Pan Li, Beijing (CN)

(73) Assignees: BEIJING BOE TECHNOLOGY DEVELOPMENT CO., LTD., Beijing (CN); BOE TECHNOLOGY GROUP CO. LTD, Beijing (CN)

( * ) Notice: Subject to any disclaimer, the term of this patent is extended or adjusted under 35 U.S.C. 154(b) by 385 days.

(21) Appl. No.: 18/546,721

(22) PCT Filed: Jul. 4, 2022

(86) PCT No.: PCT/CN2022/103659
§ 371 (c)(1),
(2) Date: Aug. 16, 2023

(87) PCT Pub. No.: WO2023/280110
PCT Pub. Date: Jan. 12, 2023

(65) Prior Publication Data

US 2024/0172525 A1 May 23, 2024

(30) Foreign Application Priority Data

Jul. 9, 2021 (CN) ......................... 202110776580.3

(51) Int. Cl.
*H10K 59/80* (2023.01)

(52) U.S. Cl.
CPC .............................. *H10K 59/80522* (2023.02)

(58) Field of Classification Search
CPC ......... H10K 59/80522; H10K 59/1315; H10K 59/824; H10K 59/80516
See application file for complete search history.

(56) References Cited

U.S. PATENT DOCUMENTS

2014/0131677 A1* 5/2014 Oh .................. H10K 59/80522 438/23
2016/0211316 A1 7/2016 Oh et al.
(Continued)

FOREIGN PATENT DOCUMENTS

CN 103311265 A 9/2013
CN 104393191 A 3/2015
(Continued)

OTHER PUBLICATIONS

The International Search Report and Written Opinion both mailed Sep. 19, 2022; PCT/CN2022/103659.

*Primary Examiner* — Eric K Ashbahian

(57) ABSTRACT

A display substrate and a manufacturing method thereof are provided. The display substrate includes a base substrate, a first metal layer, a first insulating layer, a first electrode layer, a light-emitting material layer, a carbon-containing structural layer and a second electrode layer. The first metal layer includes an auxiliary electrode pattern; the first electrode layer and the light-emitting material layer include a via hole; the second electrode layer is electrically connected to the auxiliary electrode pattern through the carbon-containing structural layer. A distance between a surface, close to the base substrate, of the first metal layer and a surface, away from the base substrate, of the second electrode layer is respectively denoted by d1 and d2, and an average carbon-oxygen ratio of the carbon-containing structural layer is respectively denoted by c1 and c2, near a middle portion and near an edge of the via hole; and $d1 < d2$ and $c1 > c2$.

19 Claims, 7 Drawing Sheets

(56) References Cited

U.S. PATENT DOCUMENTS

| | | | | |
|---|---|---|---|---|
| 2019/0207149 | A1 | 7/2019 | Yu | |
| 2019/0288044 | A1 | 9/2019 | Hou | |
| 2020/0313113 | A1* | 10/2020 | Zang | H10K 50/824 |
| 2023/0108752 | A1 | 4/2023 | Xu et al. | |

FOREIGN PATENT DOCUMENTS

| | | | |
|---|---|---|---|
| CN | 106803547 | A | 6/2017 |
| CN | 108172605 | A | 6/2018 |
| CN | 109216578 | A | 1/2019 |
| CN | 110048022 | A | 7/2019 |
| CN | 110429185 | A | 11/2019 |
| CN | 111525042 | A | 8/2020 |
| CN | 112366226 | A | 2/2021 |
| CN | 113241367 | A | 8/2021 |
| JP | 2009302025 | A | 12/2009 |

* cited by examiner

DISPLAY SUBSTRATE AND PREPARATION METHOD THEREFOR

This application is the National Stage of International Application No. PCT/CN2022/103659, filed Jul. 4, 2022, which claims priority to and the benefit of Chinese Patent Application No. 202110776580.3 filed on Jul. 9, 2021, the entireties of which are incorporated herein by reference.

TECHNICAL FIELD

Embodiments of the present disclosure relate to a display substrate and a preparation method therefor.

BACKGROUND

Organic light emitting diode (OLED) display devices have a number of advantages such as self-luminosity, high contrast, wide angle of view, low power consumption, rapid response and low manufacturing cost, have become one of key development directions of new-generation display devices, and thus have attracted increasing attention.

An organic light-emitting diode as a light-emitting element in an OLED display device usually includes a positive electrode, a negative electrode, and an organic functional layer, e.g., a light-emitting layer, located between the positive electrode and the negative electrode. When an appropriate voltage is applied to the positive electrode and the negative electrode of the organic light-emitting diode, holes injected from the positive electrodes and electrons injected from the negative electrode will be combined in the light-emitting layer and excited to emit light.

SUMMARY

At least an embodiment of the present disclosure provides a display substrate, and the display substrate comprises a base substrate, a first metal layer, a first insulating layer, a first electrode layer, a light-emitting material layer, a carbon-containing structural layer and a second electrode layer. The first metal layer is disposed on the base substrate and comprises at least one auxiliary electrode pattern; the first insulating layer is disposed on a side, away from the base substrate, of the first metal layer and comprises at least one first via hole exposing a portion of the at least one auxiliary electrode pattern; the first electrode layer, is disposed on a side, away from the base substrate, of the first insulating layer; the light-emitting material layer is disposed on a side, away from the base substrate, of the first electrode layer, and the first electrode layer and the light-emitting material layer comprise at least one second via hole which exposes a portion of the at least one auxiliary electrode pattern and is communicated with the at least one first via hole; the carbon-containing structural layer is at least partially disposed in the at least one second via hole; the second electrode layer is disposed on a side, from the base substrate, of the light-emitting material layer and the carbon-containing structural layer; the second electrode layer is electrically connected to the at least one auxiliary electrode pattern through the carbon-containing structural layer; near a middle portion of the second via hole, a distance between a surface, close to the base substrate, of the first metal layer and a surface, away from the base substrate, of the second electrode layer is denoted by d1, and an average carbon-oxygen ratio of the carbon-containing structural layer is denoted by c1; near an edge of the second via hole, a distance between a surface, close to the base substrate, of the first metal layer and a surface, away from the base substrate, of the second electrode layer is denoted by d2, and an average carbon-oxygen ratio of the carbon-containing structural layer is denoted by c2; and $d1<d2$ and $c1>c2$.

For example, in the display substrate provided by at least one embodiment of the present disclosure, $c1*d1>c2*d2$.

For example, in the display substrate provided by at least one embodiment of the present disclosure, $20*c2*d2>c1*d1>3*c2*d2$.

For example, in the display substrate provided by at least one embodiment of the present disclosure, the average carbon-oxygen ratio of the carbon-containing structural layer is greater than 1.3:1 and less than 10:1.

For example, in the display substrate provided by at least one embodiment of the present disclosure, an area of an orthographic projection of the carbon-containing structural layer on the base substrate is smaller than an area of an orthographic projection of the auxiliary electrode pattern on the base substrate.

For example, in the display substrate provided by at least one embodiment of the present disclosure, an orthographic projection of the first via hole on the base substrate is located within an orthographic projection of the auxiliary electrode pattern on the base substrate, and an orthographic projection of the second via hole on the base substrate is located within the orthographic projection of the first via hole on the base substrate.

For example, in the display substrate provided by at least one embodiment of the present disclosure, the carbon-containing structural layer comprises a first portion in contact with the auxiliary electrode pattern and a second portion located on a sidewall of the second via hole; and an orthographic projection of the first portion on the base substrate is located within the orthographic projection of the second via hole on the base substrate.

For example, in the display substrate provided by at least one embodiment of the present disclosure, at least part of the edge of the second via hole is saw-toothed.

For example, in the display substrate provided by at least one embodiment of the present disclosure, a contour of an orthographic projection of the first via hole on the auxiliary electrode pattern comprises n inflection points, and a contour of an orthographic projection of the second via hole on the auxiliary electrode pattern comprises m inflection points; and $m>n>0$.

For example, in the display substrate provided by at least one embodiment of the present disclosure, the carbon-containing structural layer has an orthographic projection, with an area denoted by S1, on the base substrate, and has an average carbon-oxygen ratio denoted by Cs1; the light-emitting material layer in a region, where the carbon-containing structural layer is not located, of the first via hole has an orthographic projection, with an area denoted by S2, on the base substrate, and has an average carbon-oxygen ratio denoted by Cs2; and a carbon-oxygen matching coefficient k is derived as follows: $k=S2*Cs2/S1*Cs1$, $0<k<2/3$.

For example, in the display substrate provided by at least one embodiment of the present disclosure, $0<k<0.2$.

For example, in the display substrate provided by at least one embodiment of the present disclosure, the auxiliary electrode pattern comprises a first protrusion portion protruding away from the base substrate, and an orthographic projection of the first protrusion portion on the base substrate is located within an orthographic projection of the second via hole on the base substrate.

For example, the display substrate provided by at least one embodiment of the present disclosure further comprises a second insulating layer located between the first metal layer and the first insulating layer, the second via hole penetrates through the second insulating layer, and the first electrode layer is in contact with the second insulating layer through the first via hole in the first insulating layer.

For example, in the display substrate provided by at least one embodiment of the present disclosure, the portion, exposed by the second via hole, of the auxiliary electrode pattern is the first protrusion portion.

For example, in the display substrate provided by at least one embodiment of the present disclosure, in a direction perpendicular to a surface of the base substrate, a thickness of the first protrusion portion is denoted by d3', and a thickness of other portion than the first protrusion portion of the auxiliary electrode pattern is denoted by d3; and d3>d3'.

For example, the display substrate provided by at least one embodiment of the present disclosure further comprises an inter-layer insulating layer disposed between the base substrate and the first metal layer; the inter-layer insulating layer comprises a second protrusion portion protruding away from the base substrate, and the first protrusion portion is disposed on a side, away from the base substrate, of the second protrusion portion.

For example, in the display substrate provided by at least one embodiment of the present disclosure, a portion of the inter-layer insulating layer that is in contact with the first protrusion portion is the second protrusion portion; in a direction perpendicular to the surface of the base substrate, a thickness of the second protrusion portion is denoted by d4', and a thickness of other portion than the second protrusion portion of the inter-layer insulating layer is denoted by d4; and d4<d4'.

For example, in the display substrate provided by at least one embodiment of the present disclosure, $(d3-d3')/d3>(d4'-d4)/d4$; and $(d3+d4-(d3'+d4'))/(d3+d4)<0.02$.

For example, in the display substrate provided by at least one embodiment of the present disclosure, a surface, close to the base substrate, of the inter-layer insulating layer is a flat surface.

For example, in the display substrate provided by at least one embodiment of the present disclosure, the auxiliary electrode pattern comprises a first slope portion at an edge of the second via hole, and the inter-layer insulating layer comprises a second slope portion at an edge of the second via hole; and a length of the first slope portion is less than a length of the second slope portion.

For example, in the display substrate provided by at least one embodiment of the present disclosure, a slope angle of the second slope portion is greater than a slope angle of the first slope portion.

For example, in the display substrate provided by at least one embodiment of the present disclosure, the slope angle of the second slope portion is greater than a slope angle of the first insulating layer at the first via hole and greater than a slope angle of the second insulating layer at the second via hole.

For example, the display substrate provided by at least one embodiment of the present disclosure further comprises a pixel driving circuit, and the pixel driving circuit comprises a transistor and a storage capacitor; the transistor comprises an active layer disposed on the base substrate, a gate electrode disposed on a side, away from the base substrate, of the active layer, and a source electrode layer and a drain electrode layer disposed on a side, away from the base substrate, of the gate electrode; the source electrode layer and the drain electrode layer are each electrically connected to the active layer; the storage capacitor comprises a first plate and a second plate; at least a part of the source electrode layer, the drain electrode layer and the second plate is in the first metal layer; and the second insulating layer is disposed on a side, away from the base substrate, of the source electrode layer and the drain electrode layer.

For example, in the display substrate provided by at least one embodiment of the present disclosure, the first insulating layer further has a third via hole exposing at least part of the second plate; and in a direction parallel to a surface of the base substrate, a maximum width of the auxiliary electrode pattern is greater than a maximum width of the third via hole.

For example, in the display substrate provided by at least one embodiment of the present disclosure, a perimeter of a contour of an orthographic projection of the second via hole on the auxiliary electrode pattern is greater than a perimeter of an orthographic projection of the third via hole on the second plate.

For example, the display substrate provided by at least one embodiment of the present disclosure further comprises a shielding metal layer disposed between the base substrate and the active layer, and a gate electrode metal pattern disposed in a same layer with the gate electrode; an orthographic projection of the gate electrode metal pattern on the base substrate is at least overlapped with an orthographic projection of the shielding metal layer on the base substrate and is at least overlapped with an orthographic projection of the source electrode layer or the drain electrode layer on the base substrate to form the storage capacitor.

For example, the display substrate provided by at least one embodiment of the present disclosure further comprises a buffer layer disposed between the shielding metal layer and the active layer; a maximum distance between a surface, away from the base substrate, of the auxiliary electrode pattern and a surface, away from the base substrate, of the buffer layer is greater than a maximum distance between the surface, away from the base substrate, of the buffer layer and a surface, away from the base substrate, of the source electrode layer and the drain electrode layer.

For example, in the display substrate provided by at least one embodiment of the present disclosure, the second insulating layer has a first sub-via hole exposing the auxiliary electrode pattern and a second sub-via hole exposing the source electrode layer or the drain electrode layer; the second insulating layer has a third slope portion at the first sub-via hole and a fourth slope portion at the second sub-via hole; and a slope angle of the third slope portion is greater than a slope angle of the fourth slope portion.

For example, in the display substrate provided by at least one embodiment of the present disclosure, in a direction perpendicular to a surface of the base substrate, the light-emitting material layer has a first light-emitting material portion overlapping the third slope portion and a second light-emitting material portion overlapping the fourth slope portion; and a thickness of the first light-emitting material portion is less than a thickness of the second light-emitting material portion.

For example, the display substrate provided by at least one embodiment of the present disclosure further comprises a light-emitting pixel column and a transparent pixel column arranged alternately; the light-emitting pixel column comprises a plurality of light-emitting pixel units, and each of the plurality of light-emitting pixel units comprises a plurality of light-emitting sub-pixels; the transparent pixel column comprises a plurality of transparent pixel units, which are defined by a gate electrode line and a boundary of the light-emitting pixel column, and each of the plurality of transparent pixel units comprises a transparent sub-pixel; and the plurality of transparent pixel units and the plurality of light-emitting pixel units are arranged in a staggered manner in a column direction.

For example, in the display substrate provided by at least one embodiment of the present disclosure, the plurality of light-emitting sub-pixels are arranged substantially in a square shape; and the transparent sub-pixel is concaved toward the light-emitting sub-pixels.

For example, in the display substrate provided by at least one embodiment of the present disclosure, each of the plurality of light-emitting pixel units comprises four sub-pixels comprising one red sub-pixel, one green sub-pixel, one blue sub-pixel and one white sub-pixel; the red sub-pixel and the blue sub-pixel are located in a same row, and the green sub-pixel and the white sub-pixel are located in a same row; and a sum of areas of light-emitting regions of the red sub-pixel and the blue sub-pixel is greater than a sum of areas of light-emitting regions of the green sub-pixel and the white sub-pixel.

For example, in the display substrate provided by at least one embodiment of the present disclosure, the red sub-pixel and the white sub-pixel are located in a same column, and the green sub-pixel and the blue sub-pixel are located in a same column; and a sum of areas of light-emitting regions of the red sub-pixel and the white sub-pixel is greater than a sum of areas of light-emitting regions of the green sub-pixel and the blue sub-pixel.

For example, in the display substrate provided by at least one embodiment of the present disclosure, the auxiliary electrode pattern is disposed in the row in which the red sub-pixel and the blue sub-pixel are located.

For example, in the display substrate provided by at least one embodiment of the present disclosure, each of the plurality of light-emitting sub-pixels comprises a light-emitting element, and the light-emitting element comprises a first electrode located in the first electrode layer, a light-emitting layer located in the light-emitting material layer, and a second electrode located in the second electrode layer; the first electrode comprises a first sub-electrode and a second sub-electrode that are electrically connected through a conductive structure; the conductive structure is electrically connected to the source electrode layer or the drain electrode layer through the second sub-via hole; and in a direction parallel to a surface of the base substrate, the second sub-via hole is located between the first sub-electrode and the second sub-electrode.

For example, in the display substrate provided by at least one embodiment of the present disclosure, in the direction parallel to the surface of the base substrate, the first sub-electrode comprises at least a first edge, a second edge, a third edge, a fourth edge and a fifth edge that are connected end to end in sequence; and at least one of the first edge, the second edge, the third edge, the fourth edge and the fifth edge is a straight edge.

For example, in the display substrate provided by at least one embodiment of the present disclosure, lengths of the first edge, the second edge, the third edge, the fourth edge and the fifth edge are denoted by L1, L2, L3, L4 and L5 in sequence; and (L3+L4+L5)2>(L1)2+(L2)2.

For example, in the display substrate provided by at least one embodiment of the present disclosure, in the direction parallel to the surface of the base substrate, the second sub-electrode comprises at least a sixth edge, a seventh edge, an eighth edge, a ninth edge and a tenth edge that are connected end to end in sequence; and at least one of the sixth edge, the seventh edge, the eighth edge, the ninth edge and the tenth edge is a straight edge.

For example, in the display substrate provided by at least one embodiment of the present disclosure, lengths of the sixth edge, the seventh edge, the eighth edge, the ninth edge and the tenth edge are denoted by L6, L7, L8, L9 and L10 in sequence; and (L8+L9+L10)2>(L6)2+(L7)2.

At least one embodiment of the present disclosure provides a display substrate, and the display substrate comprises a base substrate, an inter-layer insulating layer, a first metal layer, a first insulating layer, a first electrode layer, a light-emitting material layer, a carbon-containing structural layer and a second electrode layer; the inter-layer insulating layer is disposed on the base substrate; the first metal layer is disposed on a side, away from the base substrate, of the inter-layer insulating layer and comprises at least one auxiliary electrode pattern; the first insulating layer is disposed on a side, away from the base substrate, of the first metal layer and comprises at least one first via hole exposing a portion of the at least one auxiliary electrode pattern; the first electrode layer is disposed on a side, away from the base substrate, of the first insulating layer; the light-emitting material layer is disposed on a side, away from the base substrate, of the first electrode layer, and the first electrode layer and the light-emitting material layer comprise at least one second via hole exposing a portion of the at least one auxiliary electrode pattern and communicated with the at least one first via hole; the carbon-containing structural layer is disposed, at least in part, in the at least one second via hole; and the second electrode layer is disposed on a side, away from the base substrate, of the light-emitting material layer and the carbon-containing structural layer. In a direction perpendicular to a surface of the base substrate, a thickness of the auxiliary electrode layer is greater than a thickness of the second electrode layer; the second electrode layer is electrically connected to the at least one auxiliary electrode pattern through the carbon-containing structural layer; the auxiliary electrode pattern comprises a first slope portion at an edge of the second via hole, the inter-layer insulating layer comprises a second slope portion at an edge of the second via hole; and a length of the first slope portion is less than a length of the second slope portion.

For example, in the display substrate provided by at least one embodiment of the present disclosure, a slope angle of the second slope portion is greater than a slope angle of the first slope portion, greater than a slope angle of the first insulating layer at the first via hole and greater than a slope angle of the second insulating layer at the second via hole.

For example, in the display substrate provided by at least one embodiment of the present disclosure, a distance between a surface, close to the base substrate, of the first metal layer near a middle portion of the second via hole and a surface, away from the base substrate, of the second electrode layer is denoted by d1, and an average carbon-oxygen ratio of the carbon-containing structural layer near the middle portion of the second via hole is denoted by c1; a distance between a surface, close to the base substrate, of the first metal layer near an edge of the second via hole and the surface, away from the base substrate, of the second electrode layer near the edge of the second via hole is denoted by d2, and an average carbon-oxygen ratio of the carbon-containing structural layer is denoted by c2; and c1*d1>c2*d2.

For example, in the display substrate provided by at least one embodiment of the present disclosure, the carbon-containing structural layer comprises a first portion in contact with the auxiliary electrode pattern and a second portion located on a sidewall of the second via hole; and an orthographic projection of the first portion on the base substrate is located within an orthographic projection of the second via hole on the base substrate.

For example, in the display substrate provided by at least one embodiment of the present disclosure, at least part of the edge of the second via hole is saw-toothed.

For example, in the display substrate provided by at least one embodiment of the present disclosure, a contour of an orthographic projection of the first via hole on the auxiliary electrode pattern comprises n inflection points, and a contour of an orthographic projection of the second via hole on the auxiliary electrode pattern comprises m inflection points; and $m>n>0$.

For example, in the display substrate provided by at least one embodiment of the present disclosure, the carbon-containing structural layer has an orthographic projection, with an area denoted by S1, on the base substrate, and has an average carbon-oxygen ratio denoted by Cs1, and the light-emitting material layer in a region of the first via hole where the carbon-containing structural layer is not located, has an orthographic projection, with an area denoted by S2, on the base substrate, and has an average carbon-oxygen ratio denoted by Cs2; and a carbon-oxygen matching coefficient k is derived as follows: $k=S2*Cs2/S1*Cs1$, $0<k<2/3$.

At least an embodiment of the present disclosure provides a display substrate, and the display substrate comprises a base substrate, an inter-layer insulating layer, a first metal layer, a first insulating layer, a first electrode layer, a light-emitting material layer, a carbon-containing structural layer and a second electrode layer. The first metal layer is disposed on the base substrate and comprising at least one auxiliary electrode pattern; the first insulating layer is disposed on a side, away from the base substrate, of the first metal layer and comprises at least one first via hole exposing a portion of the at least one auxiliary electrode pattern; the first electrode layer is disposed on a side, away from the base substrate, of the first insulating layer; the light-emitting material layer disposed on a side, away from the base substrate, of the first electrode layer, and the first electrode layer and the light-emitting material layer comprise at least one second via hole exposing a portion of the at least one auxiliary electrode pattern and communicated with the at least one first via hole; the second electrode layer is disposed on a side, away from the base substrate, of the light-emitting material layer, and the second electrode layer is electrically connected to the at least one auxiliary electrode pattern through the at least one second via hole; the auxiliary electrode pattern comprises a first protrusion portion protruding away from the base substrate; and an orthographic projection of the first protrusion portion on the base substrate is located within an orthographic projection of the second via hole on the base substrate.

For example, the display substrate provided by at least one embodiment of the present disclosure further comprises a second insulating layer located between the first metal layer and the first insulating layer, the second via hole penetrates through the second insulating layer, and the first electrode layer is in contact with the second insulating layer through the first via hole in the first insulating layer.

For example, in the display substrate provided by at least one embodiment of the present disclosure, the portion of the auxiliary electrode pattern that is exposed by the second via hole is the first protrusion portion.

For example, in the display substrate provided by at least one embodiment of the present disclosure, in a direction perpendicular to a surface of the base substrate, a thickness of the first protrusion portion is denoted by d3', and a thickness of other portion than the first protrusion portion of the auxiliary electrode pattern is denoted by d3; and $d3>d3'$.

For example, the display substrate provided by at least one embodiment of the present disclosure further comprises an inter-layer insulating layer disposed between the base substrate and the first metal layer, the inter-layer insulating layer comprises a second protrusion portion protruding away from the base substrate, and the first protrusion portion is disposed on a side, away from the base substrate, of the second protrusion portion.

For example, in the display substrate provided by at least one embodiment of the present disclosure, a portion of the inter-layer insulating layer that is in contact with the first protrusion portion is the second protrusion portion; in the direction perpendicular to the surface of the base substrate, a thickness of the second protrusion portion is denoted by d4', and a thickness of other portion than the second protrusion portion of the inter-layer insulating layer is denoted by d4; and $d4<d4'$.

For example, in the display substrate provided by at least one embodiment of the present disclosure, $(d3-d3')/d3>(d4'-d4)/d4$; and $(d3+d4-(d3'+d4'))/(d3+d4)<0.02$.

For example, in the display substrate provided by at least one embodiment of the present disclosure, a surface, close to the base substrate, of the inter-layer insulating layer is a flat surface.

At least an embodiment of the present disclosure provides a preparation method of a display substrate, and the preparation method comprises: providing a base substrate; forming a first metal layer on the base substrate, wherein the first metal layer comprises at least one auxiliary electrode pattern; forming a first insulating layer (a flat layer) on a side, away from the base substrate, of the first metal layer, and forming in the first insulating layer at least one first via hole exposing a portion of the at least one auxiliary electrode pattern; forming a first electrode layer on a side, away from the base substrate, of the first insulating layer; forming a light-emitting material on a side form, away from the base substrate, of the first electrode layer, and forming in the first electrode layer and the light-emitting material layer at least one second via hole exposing a portion of the at least one auxiliary electrode pattern and communicated with the at least one first via hole; forming a carbon-containing structural layer in the at least one second via hole; and forming a second electrode on a side form, away from the base substrate, of the light-emitting material layer. The second electrode layer is electrically connected to the at least one auxiliary electrode pattern through the carbon-containing structural layer; a distance between a surface, close to the base substrate, of the first metal layer near a middle portion of the second via hole and a surface, away from the base substrate, of the second electrode layer is denoted by d1, and an average carbon-oxygen ratio of the carbon-containing structural layer near the middle portion of the second via hole is denoted by c1; a distance between a surface, close to the base substrate, of the first metal layer near an edge of the second via hole and the surface, away from the base substrate, of the second electrode layer is denoted by d2, and an average carbon-oxygen ratio of the carbon-containing structural layer near the edge of the second via hole is denoted by c2; and $d1<d2$ and $c1>c2$.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objectives, technical details, and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Similarly, similar terms such as "a", "an", or "the", etc., do not indicate the limitation of quantity, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," and the like are only used to indicate relative position relationship, and when the position of the described object is changed, the relative position relationship may be changed accordingly.

Figure 1A:
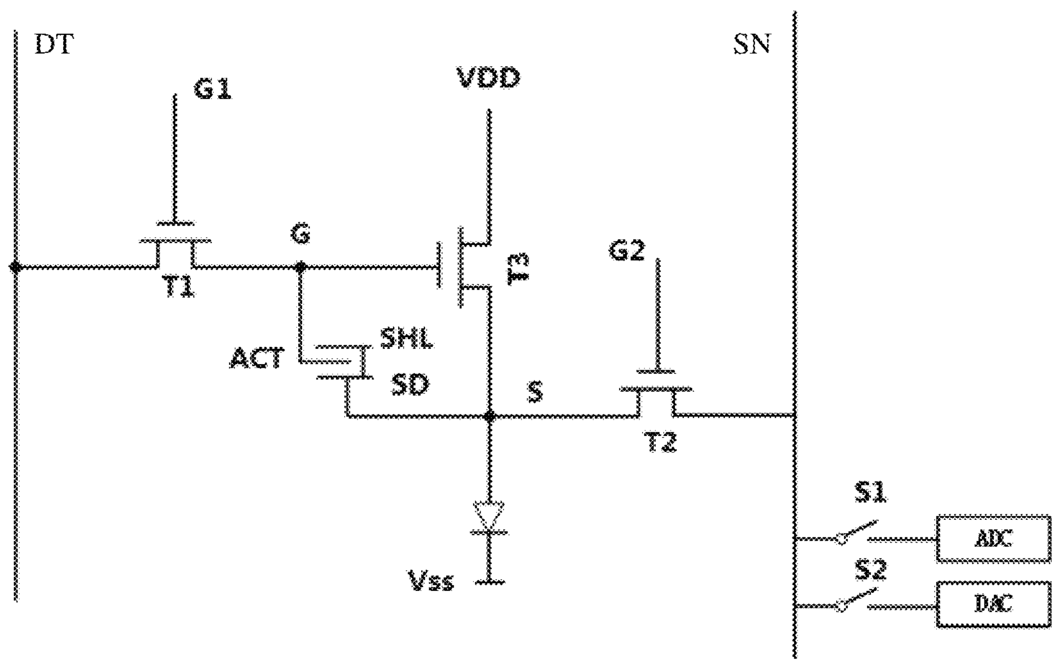
FIG. 1A is a circuit diagram of a pixel driving circuit of a display substrate provided by at least one embodiment of the present disclosure.

For a large-size OLED display device, for example, a 3T1C pixel driving circuit may be employed to drive a light-emitting element to emit light. FIG. 1A is a schematic diagram of a 3T1C pixel driving circuit, and FIG. 1B is a time sequence diagram of the pixel driving circuit in FIG. 1A.

Figure 1B:
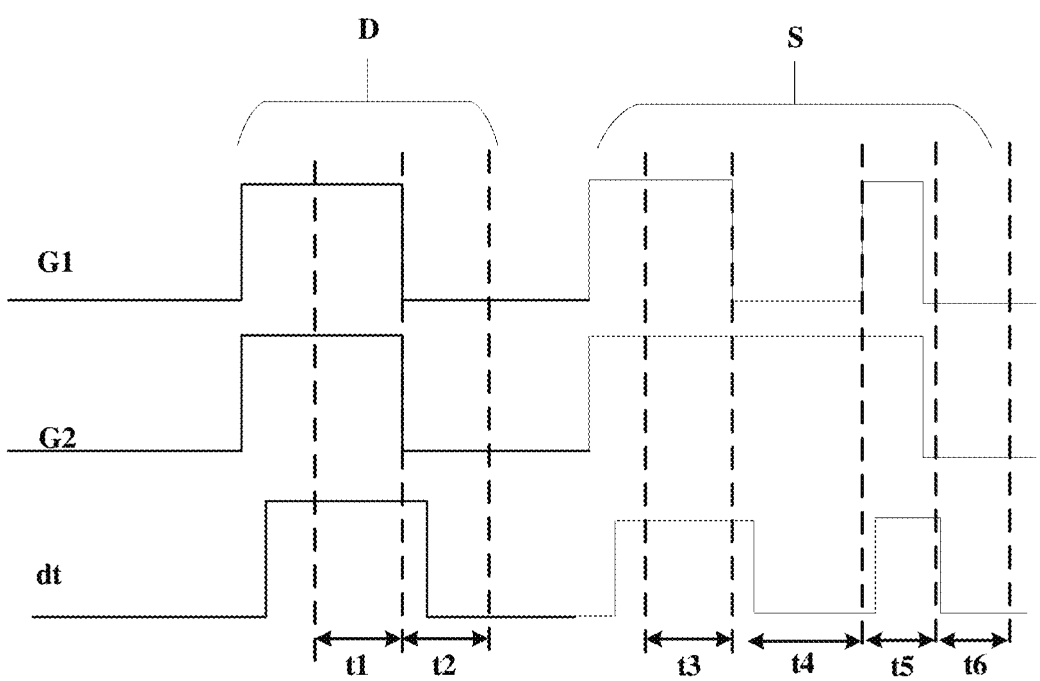
FIG. 1B is a time sequence diagram of the pixel driving circuit in FIG. 1A.

For example, as shown in FIG. 1A and FIG. 1B, the pixel driving circuit includes a first transistor T1, a second transistor T2, a third transistor T3, a storage capacitor, etc. The storage capacitor includes a first plate ACT, and second plates SHL and SD. The pixel driving circuit is connected to signal lines such as a data line DT, a sensing line SN, a high-level power line VDD and low-level power line Vss, and components such as a digital-to-analog converter (DAC) and an analog-to-digital converter (ADC), of which connection relationships are as shown in the figures.

Figure 2:
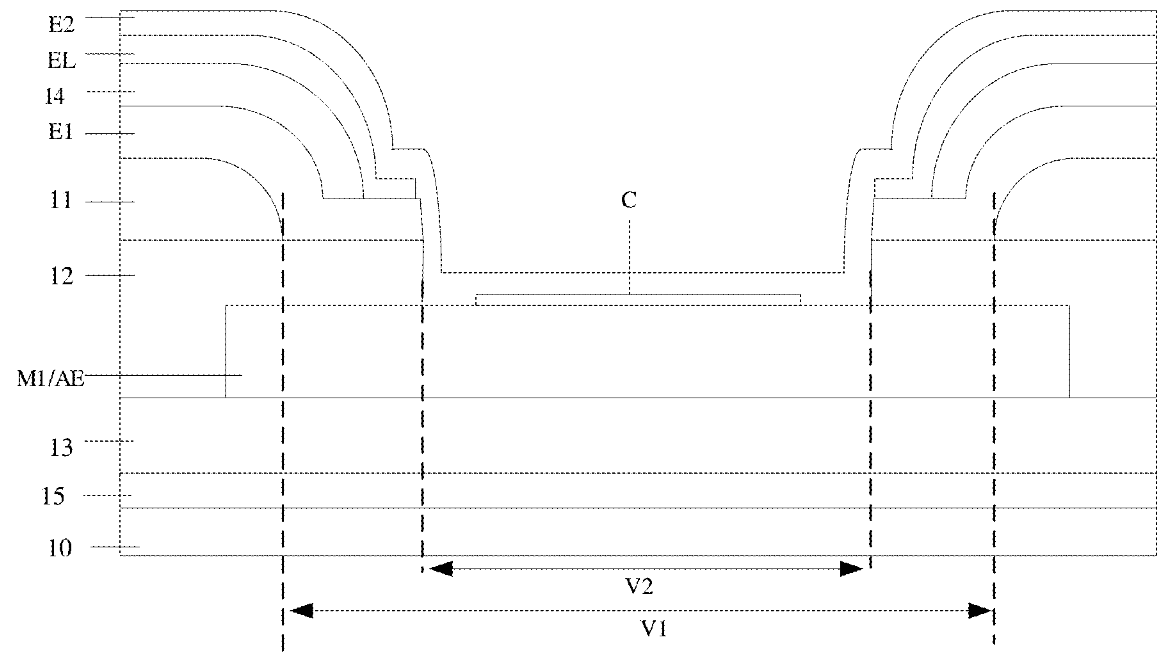
FIG. 2 is a cross-sectional schematic diagram of part of a display substrate provided by at least one embodiment of the present disclosure.

In the working process of the above-mentioned 3T1C pixel driving circuit, in combination with FIG. 1 and FIG. 2, at a time period t1, a first control signal G1 and a second control signal G2 are input as on signals to gate electrodes of the second transistor T2 and the third transistor T3 such that the second transistor T2 and the third transistor T3 are switched on, and a data signal dt is transmitted via the second transistor T2 to a gate electrode of the first transistor T1 such that the first transistor T1 is switched on. A sensing integrated circuit (IC) writes a reset signal Vint to a first electrode (e.g., a positive electrode) of a light-emitting element through the sensing line SN and the second transistor T2.

At a time period t2, the first control signal G1 and the second control signal G2 are off signals. A voltage across two terminals of the storage capacitor remains unchanged. The first transistor T1 operates in a saturated state with a current thereof remaining unchanged, and drives the light-emitting element to emit light.

At this point, if a pixel row where the light-emitting element is located needs to be compensated, a sensing phase S, i.e., time periods t3-t6, is enabled.

At the time period t3, the first control signal G1 and the second control signal G2 are input as on signals to the gate electrodes of the second transistor T2 and the third transistor T3 such that the second transistor T2 and the third transistor T3 are switched on, and the data signal dt is transmitted via the second transistor T2 to the gate electrode of the first transistor T1 such that the third transistor T3 is switched on. The sensing IC writes the reset signal Vint to the first electrode (e.g., the positive electrode) of the light-emitting element through the sensing line SN and the second transistor T2.

At the time period t4, the first transistor T1 is switched off and the second transistor T2 and the third transistor T3 are switched on, allowing discharge to a parasitic capacitor of the sensing line SN through the point S, until Vgs of the third transistor T3 is equal to Vth and the third transistor T3 is switched off. At this point, the sensing IC may calculate the Vth of the third transistor by acquiring a potential of the point S. Characteristic parameters such as a mobility of the third transistor may also be calculated according to a discharge curve of the point S at the sensing phase.

At the time period t5, the first transistor T1 is switched on and the data line DT writes a data voltage to the gate electrode of the third transistor T3. Since the pixel row where the light-emitting element does not emit light at the sensing phase, a dark line may occur during displaying. Therefore, after the period t4 ends, a data voltage is written immediately, allowing the row of pixels to emit light and reducing the influence of the dark line on the display effect.

At the time period t6, the first transistor T1 and the second transistor T2 are switched off, and the light-emitting element emits light.

The above-mentioned time periods t5 and t6 are a time sequence added for power-on compensation, and the two periods are not needed in power-off compensation.

The inventors of the present disclosure have found that when the above-mentioned pixel driving circuit is employed to drive the light-emitting element to emit light, even though a same data voltage is input, voltage differences between two terminals (i.e., the positive electrode and the negative electrode) of the light-emitting element at positions near and far away from the power line Vss are different, and an IR drop occurs. Therefore, different sub-pixels in the display substrate differ in display color, affecting the uniformity of the display effect of a display panel.

For example, for a top-emitting display substrate, the negative electrode of the light-emitting element thereof is formed with a thin semitransparent metal material such that at positions near and far away from the power line Vss, power voltages transmitted from the power line Vss and received by the negative electrodes of the light-emitting elements of different sub-pixels differ greatly, which in turn aggravates a difference in display color between different sub-pixels in the display substrate, affecting the uniformity of the display effect of the display panel.

At least one embodiment of the present disclosure provides a display substrate and a preparation method thereof. The display substrate includes a base substrate, a first metal layer, a first insulating layer, a first electrode layer, a light-emitting material layer, a carbon-containing structural layer and a second electrode layer. The first metal layer is disposed on the base substrate and includes at least one auxiliary electrode pattern. The first insulating layer is disposed on a side, far away from the base substrate, of the first metal layer and includes at least one first via hole exposing a portion of the at least one auxiliary electrode pattern. The first electrode layer is disposed on a side, far away from the base substrate, of the first insulating layer. The light-emitting material layer is disposed on a side, far away from the base substrate, of the first electrode layer. The first electrode layer and the light-emitting material layer include at least one second via hole exposing a portion of the at least one auxiliary electrode pattern and communicated with the at least one first via hole. The carbon-containing structural layer is disposed, at least in part, in the at least one second via hole. The second electrode layer is disposed on a side, far away from the base substrate, of the light-emitting material layer and the carbon-containing structural layer. The second electrode layer is electrically connected to the at least one auxiliary electrode pattern through the carbon-containing structural layer. A distance between a surface, close to the base substrate, of the first metal layer near a middle portion of the second via hole and a surface, far away from the base substrate, of the second electrode layer is denoted by d1, and an average carbon-oxygen ratio of the carbon-containing structural layer near the middle portion of the second via hole is denoted by c1; a distance between a surface, close to the base substrate, of the first metal layer near an edge of the second via hole and the surface, far away from the base substrate, of the second electrode layer is denoted by d2, and an average carbon-oxygen ratio of the carbon-containing structural layer near the edge of the second via hole is denoted by c2; and $d1<d2$ and $c1>c2$.

In the display substrate provided by the embodiment of the present disclosure, by providing the auxiliary electrode pattern connected in parallel to the second electrode layer, the transmission resistance of the second electrode layer may be reduced. By providing the carbon-containing structural layer between the electrode layer and the auxiliary electrode pattern, the contact resistance of the second electrode layer with the auxiliary electrode pattern may be reduced, thus further reducing the transmission resistance of the second electrode layer. By designing the average carbon-oxygen ratio of the carbon-containing structural layer at different positions of the second via hole and different thicknesses of the structure, the adhesion of the auxiliary electrode pattern to the second electrode layer may be further guaranteed and the contact resistance of the second electrode layer with the auxiliary electrode pattern may be reduced, improving the display uniformity of the display substrate.

The display substrate and the preparation method thereof provided in the present disclosure will be described below through several specific embodiments.

At least one embodiment of the present disclosure provides a display substrate. FIG. 2 is a cross-sectional schematic diagram of part of the display substrate. As shown in FIG. 2, the display substrate includes a base substrate 10, a first metal layer M1, a first insulating layer 11, a first electrode layer E1, a light-emitting material layer EL, a carbon-containing structural layer C and a second electrode layer E2.

As shown in FIG. 2, the first metal layer M1 is disposed on the base substrate 10 and includes at least one auxiliary electrode pattern AE, e.g., a plurality of auxiliary electrode patterns AE arranged in an array. FIG. 2 illustrates one auxiliary electrode pattern AE as an example. The first insulating layer 11 is disposed on a side, far away from the base substrate 10, of the first metal layer M1 and includes at least one first via hole V1 exposing the at least one auxiliary electrode pattern AE. The first electrode layer E1 is disposed on a side, far away from the base substrate 10, of the first insulating layer 11. The light-emitting material layer EL is disposed on a side, far away from the base substrate 10, of the first electrode layer E1. The first electrode layer E1 and the light-emitting material layer EL include at least one second via hole V2 exposing the at least one auxiliary electrode pattern AE and communicated with the at least one first via hole V1.

For example, the carbon-containing structural layer C is disposed in the at least one second via hole V2. The carbon-containing structural layer C may be made of a carbon-containing material, such as activated carbon, graphene, carbon nanotubes, and may have a sheet resistance between 0.01 Ω/sq and 500 Ω/sq. For example, a sheet resistance of the auxiliary electrode pattern AE is less than that of the second electrode layer E2. For example, in a direction perpendicular to a surface of the base substrate 10, a thickness of the auxiliary electrode layer AE is greater than that of the second electrode layer E2. The second electrode layer E2 is disposed on a side, far away from the base substrate 10, of the light-emitting material layer EL and the carbon-containing structural layer C such that the second electrode layer E2 is electrically connected to the at least one auxiliary electrode pattern AE through the carbon-containing structural layer C. Thus, the second electrode layer E2 is connected in parallel to the carbon-containing structural layer C, and the transmission resistance and the IR drop of the second electrode layer E2 may be reduced.

Figure 3:
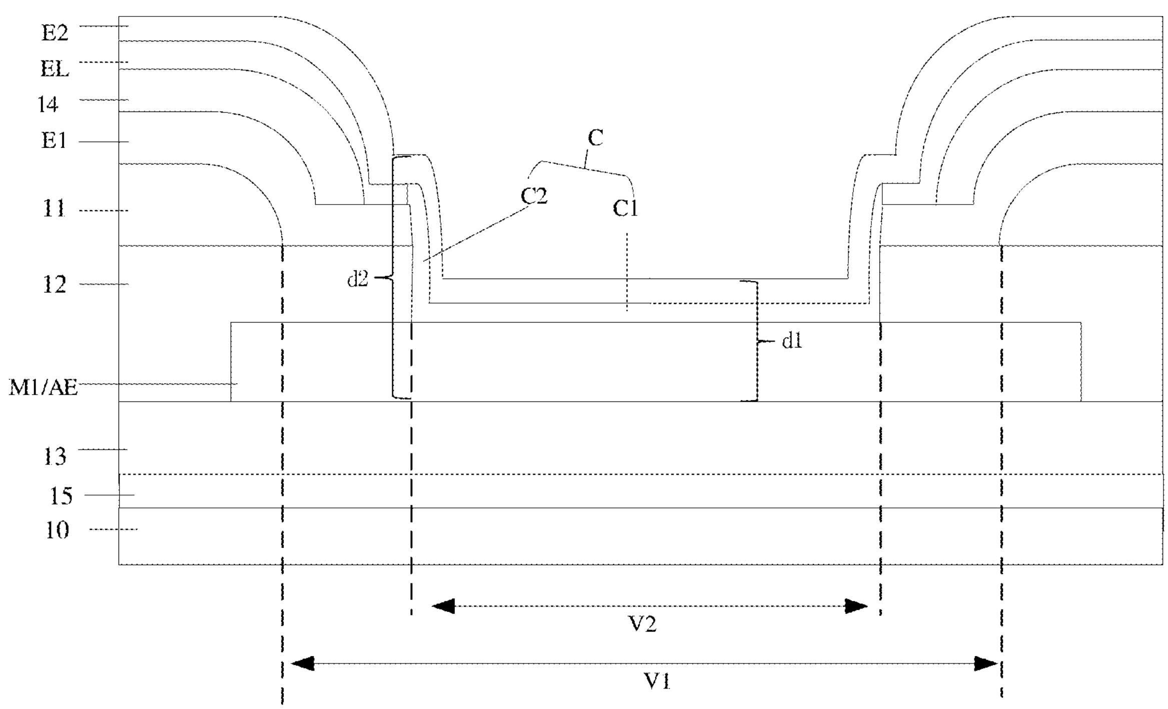
FIG. 3 is a cross-sectional schematic diagram of another part of a display substrate provided by at least one embodiment of the present disclosure.

For example, in some embodiments, as shown in FIG. 2, the carbon-containing structural layer C may be disposed at a middle position of the second via hole V2. Alternatively, in another embodiments, as shown in FIG. 3, the carbon-containing structural layer C may also be disposed on a sidewall of the second via hole V2, and in this case, the carbon-containing structural layer C includes a first portion C1 in contact with the auxiliary electrode pattern AE and a second portion C2 located on the sidewall of the second via hole V2. This arrangement may increase a contact area of the carbon-containing structural layer C with the second electrode layer E2 to further reduce the transmission resistance of the second electrode layer E2.

For example, as shown in FIG. 3, a distance between a surface, close to the base substrate 10, of the first metal layer M1 near the middle portion of the second via hole V2 and a surface, far away from the base substrate 10, of the second electrode layer E2 is denoted by d1, and an average carbon-oxygen ratio of the carbon-containing structural layer C at this position is denoted by c1; a distance between a surface, close to the base substrate 10, of the first metal layer M1 near an edge of the second via hole V2 and the surface, far away from the base substrate, of the second electrode layer E2 is denoted by d2, and an average carbon-oxygen ratio of the carbon-containing structural layer C at this position is denoted by c2; and $$d1<d2 \text{ and } c1>c2.$$

In the embodiments of the present disclosure, a carbon-oxygen ratio of a structure refers to a ratio of a carbon content and an oxygen content in the material of the structure; and an average carbon-oxygen ratio of a structure refers to the average value of average carbon-oxygen ratios of the structure at different positions.

For example, in some embodiments, the greater the distance between the surface, close to the base substrate 10, of the first metal layer M1 and the surface, far away from the base substrate 10, of the second electrode layer E2, the lower the average carbon-oxygen ratio of the carbon-containing structural layer C at this position. Thus, a good lapping effect of the auxiliary electrode pattern AE with the second electrode layer E2 may be guaranteed, and a portion, close to the center of the second via hole V2, of the carbon-containing structural layer C has a higher electric conductivity rate than a portion of the carbon-containing structural layer C close to the edge of the second via hole V2, which can effectively improve the electrical conductivity of the second electrode layer E2 and reduce the IR drop of the second electrode layer E2.

For example, in some embodiments, c1*d1>c2*d2. Due to a large segment difference at an edge of the first via hole V1, this position is at the risk of film breakage. Therefore, the carbon-oxygen ratio of the carbon-containing structural layer C needs to be fine regulated. By letting c1*d1>c2*d2, the adhesion of the auxiliary electrode pattern AE to the second electrode layer E2 may be further guaranteed and the contact resistance of the auxiliary electrode pattern AE with the second electrode layer E2 may be reduced, improving the display uniformity of the display substrate, e.g., effectively improving the display uniformity of a large-size display substrate.

For example, in some embodiments, 20*c2*d2>c1*d1>3*c2*d2. For example, in some examples, 10*c2*d2>c1*d1>5*c2*d2, and in some examples, 5*c2*d2>c1*d1>2*c2*d2. The above-mentioned parameter designs are conducive to further improving the display uniformity of the large-size display substrate.

For example, in some embodiments, the average carbon-oxygen ratio of the carbon-containing structural layer C is greater than 1.3:1 and less than 10:1, e.g., 2:1, 3:1, 5:1 or 8:1. In this case, the carbon-containing structural layer C has high electrical conductivity, and the contact resistance of the auxiliary electrode pattern AE with the second electrode layer E2 may be effectively reduced. For example, in some examples, the average carbon-oxygen ratio of the portion, close to the center of the second via hole V2, of the carbon-containing structural layer C may be 7:1, 8:1, 9:1 or the like, and the average carbon-oxygen ratio of the portion, close to the edge of the second via hole V2, of the carbon-containing structural layer C may be 3:1, 4:1, 5:1 or the like.

For example, in some other embodiments, the average carbon-oxygen ratio of the carbon-containing structural layer C is greater than 3:1 and less than 11:1; or, the average carbon-oxygen ratio of the carbon-containing structural layer C is greater than 4:1 and less than 12:1; or, the average carbon-oxygen ratio of the carbon-containing structural layer C is greater than 5:1 and less than 13:1; or, the average carbon-oxygen ratio of the carbon-containing structural layer C is greater than 6:1 and less than 15:1; or, the average carbon-oxygen ratio of the carbon-containing structural layer C is greater than 7:1 and less than 20:1. These parameter designs are conducive to reducing the contact resistance of the auxiliary electrode pattern AE with the second electrode layer E2.

Figure 4:
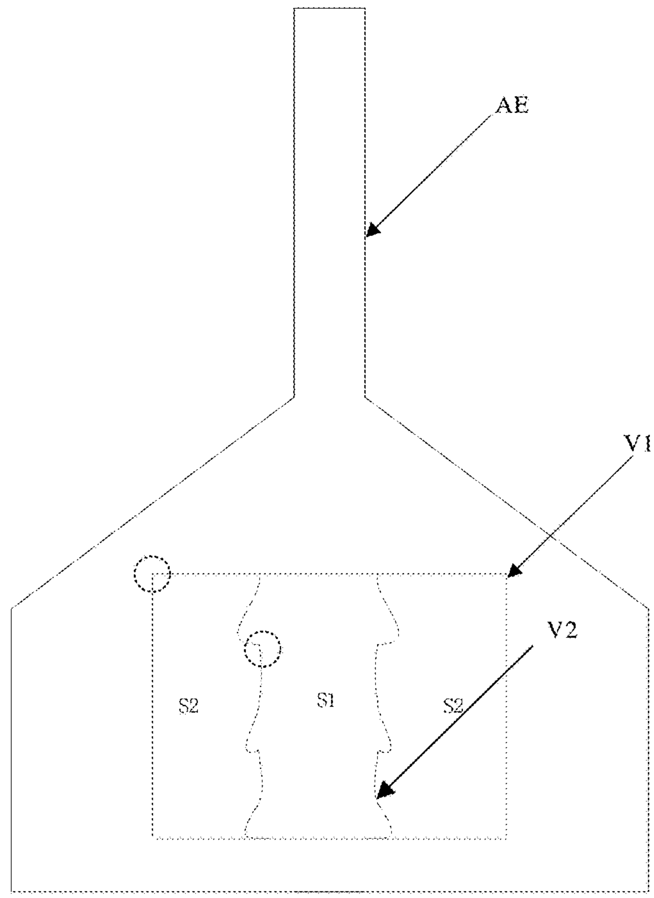
FIG. 4 is a planar schematic diagram of an auxiliary electrode pattern, a first via hole and a second via hole of a display substrate provided by at least one embodiment of the present disclosure.

For example, FIG. 4 is a planar schematic diagram of the auxiliary electrode pattern, the first via hole and the second via hole. As shown in FIG. 4, an orthographic projection of the first via hole V1 on the base substrate 10 is located within an orthographic projection of the auxiliary electrode pattern AE on the base substrate 10, and an orthographic projection of the second via hole V2 on the base substrate 10 is located within the orthographic projection of the first via hole V1 on the base substrate 10. For example, an orthographic projection of the first portion C1 of the carbon-containing structural layer C on the base substrate 10 is located within the orthographic projection of the second via hole V2 on the base substrate 10.

For example, as shown in FIG. 4, an area of an orthographic projection of the carbon-containing structural layer C on the base substrate 10 is smaller than an area of an orthographic projection of the auxiliary electrode pattern AE on the base substrate 10. Thus, the adverse effect of particles generated during the fabrication of the carbon-containing structural layer on other regions of the display substrate may be reduced.

For example, in some embodiments, as shown in FIG. 4, at least part of the edge of the second via hole V2 is saw-toothed. For example, FIG. 4 shows that two opposite edges (left and right edges in the figure) of the second via hole V2 are saw-toothed. In other embodiments, one edge or all edges of the second via hole V2 may be saw-toothed, which will not be particularly limited in the embodiments of the present disclosure.

In the embodiments of the present disclosure, at least part of the edge of the second via hole V2 is saw-toothed so that the contact area of the second portion C2 of the carbon-containing structural layer C with the second electrode layer E2 can be increased, thus further reducing the transmission resistance of the second electrode layer E2.

For example, in some embodiments, as shown in FIG. 4, a contour of an orthographic projection of the first via hole V1 on the auxiliary electrode pattern AE includes n inflection points, e.g., the portion defined by the dotted circle in the figure, and a contour of an orthographic projection of the second via hole V2 on the auxiliary electrode pattern AE includes m inflection points, e.g., the portion defined by the dotted circle in the figure; and m>n>0. Thus, the second via hole V2 is more irregular than the first via hole V1, and therefore, the contact area of the second via hole V2 with the second portion C2 of the carbon-containing structural layer C is greater.

For example, in some embodiments, as shown in FIG. 4, the area of the orthographic projection of the carbon-containing structural layer C on the base substrate 10 is denoted by S1, with an average carbon-oxygen ratio denoted by Cs1, and an area of an orthographic projection, on the base substrate 10, of the light-emitting material layer EL in a region in which the first via hole V1 does not include the carbon-containing structural layer C is denoted by S2, with an average carbon-oxygen ratio denoted by Cs2; and a carbon-oxygen matching coefficient k is derived as follows:

$$k=S2*Cs2/S1*Cs1,\ 0<k<2/3.$$

For example, in some examples, 0<k<0.2. For example, in some examples, k may be 0.05, 0.1, 0.2, 0.3, 0.4, 0.5 or the like. Thus, the carbon-containing structural layer C may be disposed by fully utilizing the space of the first via hole to reduce the transmission resistance of the second electrode layer E2, reduce the IR drop of the second electrode layer E2 and improve the display uniformity of the display substrate.

Figure 5:
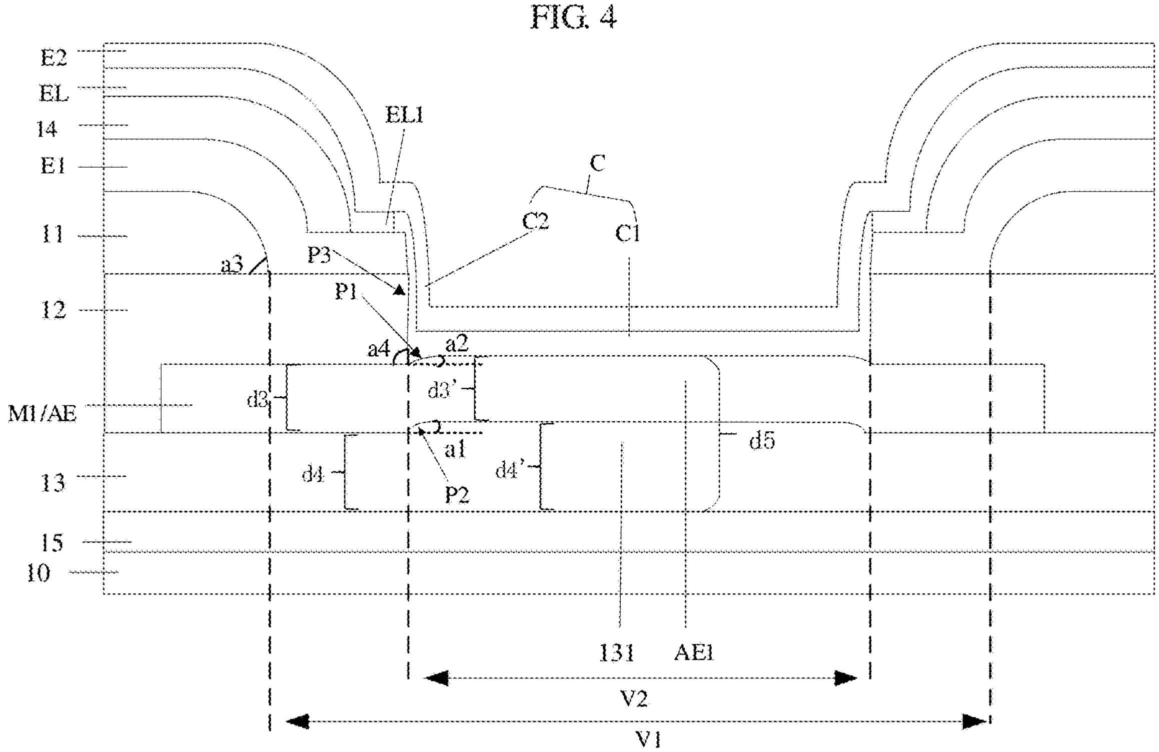
FIG. 5 is a cross-sectional schematic diagram of still another part of a display substrate provided by at least one embodiment of the present disclosure.

For example, FIG. 5 is a cross-sectional schematic diagram of another part of the display substrate. As shown in FIG. 5, in some embodiments, the auxiliary electrode pattern AE includes a first protrusion portion AE1 protruding away from the base substrate 10; and an orthographic projection of the first protrusion portion AE1 on the base substrate 10 is located within the orthographic projection of the second via hole V2 on the base substrate 10. For example, in some embodiments, the portion of the auxiliary electrode pattern AE that is exposed by the second via hole V2 is the first protrusion portion AE1.

For example, in some embodiments, as shown in FIG. 5, in the direction perpendicular to the surface of the base substrate 10, i.e., in the vertical direction in the figure, a thickness of the first protrusion portion AE1 is denoted by d3', and a thickness of other portion than the first protrusion portion AE1 of the auxiliary electrode pattern AE is denoted by d3; and d3>d3'.

For example, in some embodiments, as shown in FIG. 5, the display substrate may further include an inter-layer insulating layer 13. The inter-layer insulating layer 13 is disposed between the base substrate 10 and the first metal layer M1 and includes a second protrusion portion 131 protruding away from the base substrate 10. The first protrusion portion AE1 is disposed on a side, far away from the base substrate 10, of the second protrusion portion 131.

For example, a portion of the inter-layer insulating layer 13 that is in contact with the first protrusion portion AE1 is the second protrusion portion 131. In the direction perpendicular to the surface of the base substrate 10, i.e., in the vertical direction in the figure, a thickness of the second protrusion portion 131 is denoted by d4', and a thickness of other portion than the second protrusion portion 131 of the inter-layer insulating layer 13 is denoted by d4; and d4<d4'.

During the preparation of the display substrate, when the second via hole V2 exposing the auxiliary electrode pattern AE is formed, the auxiliary electrode pattern AE is prone to having a concave structure such that the auxiliary electrode pattern AE is prone to breakage at the second via hole V2. The inter-layer insulating layer 13 in contact with the auxiliary electrode pattern AE is formed as a convex structure at the second via hole V2, and the auxiliary electrode pattern AE also correspondingly has a convex structure. Thus, undesirable phenomena such as breakage of the auxiliary electrode pattern AE may be avoided, and the contact effect of the auxiliary electrode pattern AE with the carbon-containing structural layer C may be improved.

For example, in some embodiments, the thickness d3' of the first protrusion portion AE1, the thickness d3 of other portion than the first protrusion portion AE1 of the auxiliary electrode pattern AE, the thickness d4' of the second protrusion portion 131 and the thickness d4 of other portion than the second protrusion portion 131 of the inter-layer insulating layer 13 are in the following relationships:

$$(d3-d3')/d3>(d4'-d4)/d4;\ \text{and}$$

$$(d3+d4-(d3'+d4'))/(d3+d4)<0.02.$$

When the arrangement of the protrusion portions of the auxiliary electrode pattern AE and the inter-layer insulating layer 13 satisfies the above relationships, a better effect of lapping among the auxiliary electrode pattern AE, the carbon-containing structural layer C and the second electrode layer E2 is achieved to reduce the transmission resistance of the second electrode layer E2 to a greater extent.

For example, in some embodiments, as shown in FIG. 5, a surface, close to the base substrate 10, of the inter-layer insulating layer 13 is a flat surface.

For example, in some embodiments, as shown in FIG. 5, the auxiliary electrode pattern AE includes a first slope portion Plat an edge of the second via hole V2, and the inter-layer insulating layer 13 includes a second slope portion P2 at the edge of the second via hole V2; and a length of the first slope portion P1 is less than that of the second slope portion P2.

In the embodiments of the present disclosure, a length of a slope portion of a structure refers to a length of a curve of a climbing portion shown in the cross-sectional diagram when the structure climbs from one plane to another plane. For example, in the cross-sectional diagram shown in FIG. 5, the length of the first slope portion P1 refers to a length of an arc indicated by P1, and the length of the second slope portion P2 refers to a length of an arc indicated by P2.

For example, in some embodiments, a slope angle a1 of the second slope portion P2 is greater than a slope angle a2 of the first slope portion P1. In this case, the first slope portion P1 is gentler, which is conducive to improving the lapping effect of the auxiliary electrode pattern AE with the carbon-containing structural layer C.

For example, in some embodiments, as shown in FIG. 5, the display substrate may further include a second insulating layer 12. The second insulating layer 12 is located between the first metal layer M1 and the first insulating layer 11. The second via hole V2 penetrates through the second insulating layer 12. The first electrode layer E1 is in contact with the second insulating layer 12 through the first via hole V1 of the first insulating layer 11.

For example, in some embodiments, as shown in FIG. 5, the slope angle a1 of the second slope portion P2 is also greater than a slope angle a3 of the first insulating layer 11 at the first via hole V1 and greater than a slope angle a4 of the second insulating layer 12 at the second via hole V2. In this case, the slope angle a3 of the first insulating layer 11 at the first via hole V1 and the slope angle a4 of the second insulating layer 12 at the second via hole V2 are both gentle, which is conducive to forming the carbon-containing structural layer C on the sidewall of the second via hole V2 and further improving the lapping effect of the carbon-containing structural layer C with the second electrode layer E2.

For example, a display region of the display substrate includes a plurality of light-emitting sub-pixels arranged in an array. Each light-emitting sub-pixel includes a light-emitting element and a pixel driving circuit for driving the light-emitting element. The pixel driving circuit is, for example, the 3T1C pixel driving circuit shown in FIG. 1A.

Figure 6:
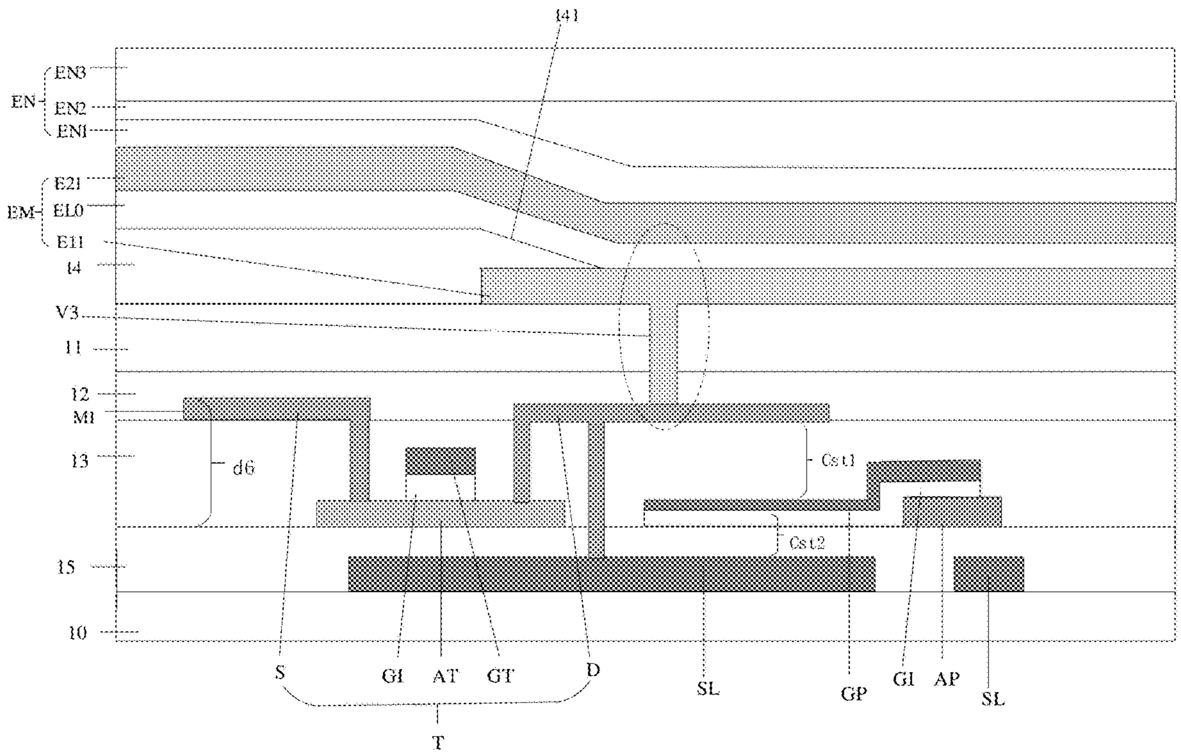
FIG. 6 is a partial cross-sectional schematic diagram of a display region of a display substrate provided by at least one embodiment of the present disclosure.

For example, FIG. 6 is a partial cross-sectional schematic diagram of the pixel driving circuit of one light-emitting sub-pixel of the display substrate. As shown in FIG. 6, the pixel driving circuit includes a transistor T (e.g., a thin-film transistor, implemented as the third transistor T3 in the 3T1C pixel driving circuit shown in FIG. 1A) and a storage capacitor. The transistor T includes an active layer AT disposed on the base substrate 10, a gate electrode GT disposed on a side, far away from the base substrate 10, of the active layer AT, and a source electrode layer S and a drain electrode layer D disposed on a side, far away from the base substrate 10, of the gate electrode GT. The source electrode layer S and the drain electrode layer D are each electrically connected to the active layer AT. The storage capacitor includes a first plate and a second plate. For example, at least part of the source electrode layer S, the drain electrode layer D and the second plate are disposed in the first metal layer M1, i.e., disposed in a same layer with the auxiliary electrode pattern AE, and the second insulating layer 12 is disposed on a side, far away from the base substrate 10, of the source electrode layer S and the drain electrode layer D. For example, in the example shown in FIG. 6, the drain electrode layer D may be reused as at least part of the second plate.

In the embodiments of the present disclosure, "disposed in a same layer" means that two functional layers or structural layers are formed in a same layer in a hierarchical structure of a display substrate or formed with a same material. That is, in a preparation process, the two functional layers or structural layers may be formed from a same material layer, and a desired pattern and structure may be formed through a same patterning process.

For example, in some embodiments, as shown in FIG. 6, the display substrate may further include a shielding metal layer SL disposed between the base substrate 10 and the active layer AT and a gate electrode metal pattern GP disposed in a same layer with the gate electrode GT. The shielding metal layer SL may shield the active layer AT from light, avoiding external light from producing an adverse effect on the normal working of the transistor T. For example, an orthographic projection of the gate electrode metal pattern GP on the base substrate 10 overlaps, at least in part, an orthographic projection of the shielding metal layer SL on the base substrate 10 and overlaps, at least in part, an orthographic projection of the source electrode layer S or the drain electrode layer D (shown in the figure is the drain electrode layer D) on the base substrate 10. Thus, the drain electrode layer D and the gate electrode metal pattern GP form a first sub-capacitor Cst1, and the shielding metal layer SL and the gate electrode metal pattern GP form a second sub-capacitor Cst2. In combination with FIG. 1A, the gate electrode metal pattern GP forms the first plate ACT of the storage capacitor in the 3T1C pixel driving circuit, and the shielding metal layer SL and the drain electrode layer D form the second plates SHL and SD of the storage capacitor, respectively.

For example, as shown in FIG. 6, the light-emitting element EM included in each light-emitting sub-pixel includes a first electrode E11 located in the first electrode layer E1, a light-emitting layer EL0 located in the light-emitting material layer EL, and a second electrode E21 located in the second electrode layer E2. The first electrode E11 is electrically connected to the source electrode layer S or the drain electrode layer D of the transistor T (shown in FIG. 6 is being electrically connected to the drain electrode layer). For example, in some embodiments, the second electrode E21 of the light-emitting element EM of each light-emitting sub-pixel is of an integrally connected structure. For example, the second electrode layer E2 is an entire-surface structure formed on the base substrate 10. For example, the first electrode E11 may be the positive electrode of the light-emitting element EM, and the second electrode E21 may be the negative electrode of the light-emitting element EM.

For example, the first insulating layer 11 further has a third via hole V3 exposing at least part of the second plate (e.g., the part of the drain electrode layer D). In a direction parallel to the surface of the base substrate 10, a maximum width of the auxiliary electrode pattern AE is greater than that of the third via hole V3. For example, a perimeter of the contour of the orthographic projection of the second via hole V2 on the auxiliary electrode pattern AE is greater than that of an orthographic projection of the third via hole V3 on the second plate.

For example, as shown in FIG. 4 and FIG. 6, the display substrate may further include a buffer layer 15 disposed between the shielding metal layer SL and the active layer AT. A maximum distance d5 between a surface, far away from the base substrate 10, of the auxiliary electrode pattern AE and a surface, far away from the base substrate 10, of the buffer layer 15 is greater than a maximum distance d6 between a surface, far away from the base substrate 10, of the source electrode layer S and the drain electrode layer D and the surface, far away from the base substrate 10, of the buffer layer 15.

For example, as shown in FIG. 6, the display substrate may further include a pixel defining layer 14. The pixel defining layer 14 has a sub-pixel opening 141 exposing the first electrode E11 of the light-emitting element EM. The sub-pixel opening 141 defines a light-emitting region of the light-emitting element EM (or the light-emitting sub-pixel). For example, the display substrate may further include an encapsulation layer EN. The encapsulation layer EN may include a first encapsulation sub-layer EN1, a second encapsulation sub-layer EN2 and a third encapsulation sub-layer EN3 to form a composite encapsulation layer. For example, the first encapsulation sub-layer EN1 and the third encapsulation sub-layer EN3 are inorganic encapsulation layers and the second encapsulation sub-layer EN2 is an organic encapsulation layer to achieve a better encapsulation effect.

Figure 7:
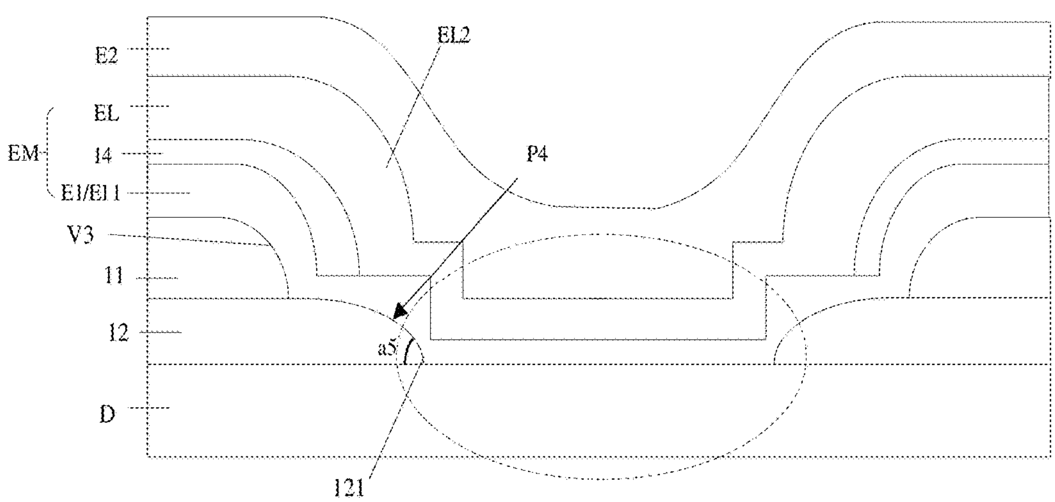
FIG. 7 is an enlarged schematic diagram of the display substrate in FIG. 6 at the position of the dashed box and a surrounding region thereof.

For example, FIG. 7 is an enlarged schematic diagram of the display substrate in FIG. 6 at the position of the dashed box and a surrounding region thereof. As shown in FIG. 7, the second insulating layer 12 has a first sub-via hole (i.e., a portion of the second via hole V2) exposing the auxiliary electrode pattern and a second sub-via hole 121 exposing the source electrode layer S or the drain electrode layer D (the case shown in FIG. 6). In combination with FIG. 5 and FIG. 7, the second insulating layer 12 has a third slope portion P3 at the first sub-via hole. For example, the first sub-via hole is defined by the surrounding third slope portion P3. The second insulating layer 12 has a fourth slope portion P4 at the second sub-via hole 121. For example, the second sub-via hole 121 is defined by the surrounding fourth slope portion P4. For example, a slope angle of the third slope portion P3, namely the slope angle a4, is greater than a slope angle a5 of the fourth slope portion P4.

In the embodiments of the present disclosure, since the first electrode E11 is electrically connected to the drain electrode layer D of the transistor T through the second sub-via hole 121 formed by the fourth slope portion P4 and there is no carbon-containing structural layer C at the second sub-via hole 121, a better electrical connection effect of the first electrode E11 with the drain electrode layer D may be guaranteed by making the fourth slope portion P4 gentle, i.e., flatter than the third slope portion P3.

For example, in some embodiments, in combination with FIG. 5 and FIG. 7, in the direction perpendicular to the surface of the base substrate 10, i.e., in the vertical direction in the figure, the light-emitting material layer EL has a first light-emitting material portion EL1 overlapping the third slope portion P3 (i.e., the portion, close to the second via hole V2, of the light-emitting material layer EL) and a second light-emitting material portion EL2 overlapping the fourth slope portion P4, and a thickness of the first light-emitting material portion EL1 is less than that of the second light-emitting material portion EL2. Since the second light-emitting material portion EL2 at the fourth slope portion P4 is sandwiched between the first electrode E11 and the second electrode E21 and configured to emit light, the second light-emitting material portion EL2 is made thicker so as to guarantee that the light-emitting element EM has a higher brightness at this position and prolong the service life of the light-emitting element EM.

Figure 8:
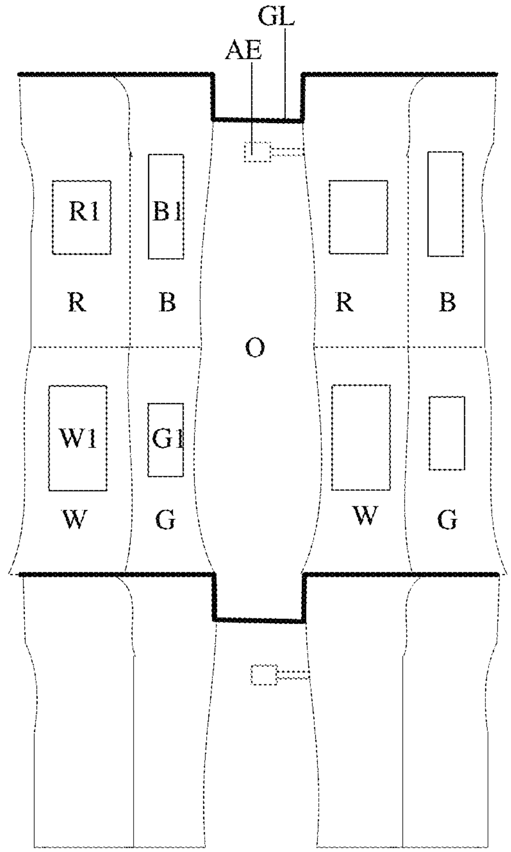
FIG. 8 is a planar schematic diagram of a display substrate provided by at least one embodiment of the present disclosure.

For example, in some embodiments, the display substrate includes a light-emitting pixel column and a transparent pixel column arranged alternately, whereby a transparent display effect can be achieved. For example, the auxiliary electrode pattern AE may be disposed in the transparent pixel column. For example, FIG. 8 is a planar schematic diagram of the light-emitting pixel column and the transparent pixel column. as shown in FIG. 8, the light-emitting pixel column includes a plurality of light-emitting pixel units, each of which includes a plurality of light-emitting sub-pixels, for example, four light-emitting sub-pixels R/G/B/W as shown in the figure. The transparent pixel column includes a plurality of transparent pixel units, which are defined by the gate electrode line GL and a boundary of the light-emitting pixel column, and each of the plurality of transparent pixel units includes one transparent sub-pixel O.

For example, as shown in FIG. 8, the plurality of transparent pixel units and the plurality of light-emitting pixel units are arranged in a staggered manner along the column direction. For example, the gate electrode line GL has a sunken portion between adjacent light-emitting pixel columns such that the plurality of transparent pixel units defined by the gate electrode line GL are arranged in a staggered manner with the plurality of light-emitting pixel units along the column direction. Thus, the influence of the diffraction effect of a metal line (e.g., the gate electrode line GL) on the display effect may be effectively reduced.

For example, in some embodiments, there is one column of transparent pixel units between every two adjacent columns of light-emitting pixel units, and there is one column of light-emitting pixel units between every two adjacent columns of transparent pixel units. For example, the plurality of light-emitting sub-pixels are arranged substantially in a square shape; and the transparent sub-pixel O is concaved toward the light-emitting sub-pixels. That is, an edge of the transparent sub-pixel O is nonlinear and concaved toward the light-emitting sub-pixels. Thus, the light transmissivity of the display substrate may be effectively improved, and then the transparent display effect of the display substrate may be improved.

For example, in some embodiments, as shown in FIG. 8, each light-emitting pixel unit includes four sub-pixels, namely one red sub-pixel R, one green sub-pixel G, one blue sub-pixel B and one white sub-pixel W. For example, the red sub-pixel R and the blue sub-pixel B are located in a same row, and the green sub-pixel G and the white sub-pixel W are located in a same row. For example, when the light emitted by the light-emitting pixel unit reaches white balance, an area of a light-emitting region of a pixel row having a high brightness is smaller than that of a light-emitting region of a pixel row having a low brightness. For example, in some examples, when the light emitted by the light-emitting pixel unit reaches white balance, the brightness satisfies: the brightness of the green sub-pixel G>the brightness of the red sub-pixel R>the brightness of the blue sub-pixel B.

For example, in some embodiments, a sum of areas of the light-emitting region R1 of the red sub-pixel R and the light-emitting region B1 of the blue sub-pixel B is greater than a sum of areas of the light-emitting region G1 of the green sub-pixel G and the light-emitting region W1 of the white sub-pixel W.

It needs to be noted that the light-emitting region of each light-emitting sub-pixel described above is defined by the sub-pixel opening 141 of the pixel defining layer 14. The light-emitting region of each light-emitting sub-pixel shown in FIG. 8 is rectangular, which is merely exemplary. In some embodiments, the shape of the light-emitting region may also be a polygon such as a pentagon or a hexagon, or some irregular shapes. The shapes of the light-emitting regions of the light-emitting sub-pixels may be the same or different. The embodiments of the present disclosure have no limitation on the specific form of each light-emitting region.

For example, in some embodiments, the auxiliary electrode pattern AE is disposed in the row in which the red sub-pixel R and the blue sub-pixel B are located. In the embodiments of the present disclosure, by disposing the auxiliary electrode pattern in the pixel row having the light-emitting region with a larger area, the transmission resistance of the second electrodes of the light-emitting sub-pixels in this row may be further reduced. The IR drop may be reduced and the display uniformity may be improved.

For example, in some embodiments, as shown in FIG. 8, the red sub-pixel R and the white sub-pixel W are located in a same column, and the green sub-pixel G and the blue sub-pixel B are located in a same column. A sum of areas of the light-emitting regions of the red sub-pixel R and the white sub-pixel W is greater than a sum of areas of the light-emitting regions of the green sub-pixel G and the blue sub-pixel B. For example, in some embodiments, the area of the light-emitting region of the blue sub-pixel B is greater than the area of the light-emitting region of the red sub-pixel R which is greater than the area of the light-emitting region of the green sub-pixel G The area of the light-emitting region of the white sub-pixel W may be selected as needed. For example, the area of the light-emitting region of the white sub-pixel W is greater than the area of the light-emitting region of the blue sub-pixel B.

Figure 9:
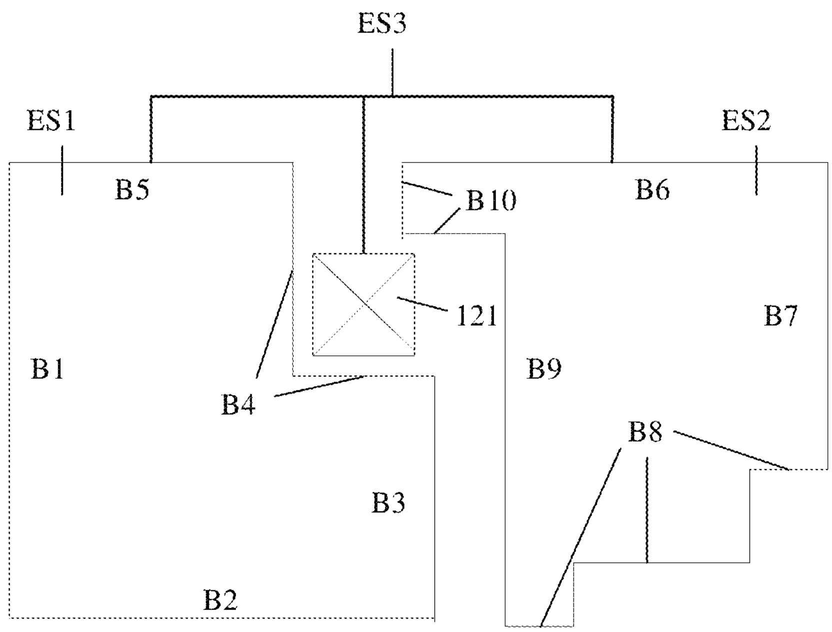
FIG. 9 is a planar schematic diagram of a first electrode of a light-emitting element of a display substrate provided by at least one embodiment of the present disclosure.

For example, FIG. 9 is a planar schematic diagram of the first electrode of the light-emitting element. As shown in FIG. 9, the first electrode E11 of at least part (e.g., each) of the light-emitting elements EM may include a first sub-electrode ES1 and a second sub-electrode ES2 that are electrically connected through an electrically conductive structure ES3. The electrically conductive structure ES3 is electrically connected to the source electrode layer S or the drain electrode layer D through the second sub-via hole 121. In the direction parallel to the surface of the base substrate 10, the second sub-via hole 121 is located between the first sub-electrode ES1 and the second sub-electrode ES2.

In the embodiments of the present disclosure, by dividing one first electrode E11 into two electrically connected sub-electrodes, the transparent display effect of the display substrate may be further improved.

For example, as shown in FIG. 9, in the direction parallel to the surface of the base substrate 10, the first sub-electrode ES1 includes at least a first edge B1, a second edge B2, a third edge B3, a fourth edge B4 and a fifth edge B5 that are connected end to end in sequence. At least one of the first edge B1, the second edge B2, the third edge B3, the fourth edge B4 and the fifth edge B5 is a straight edge, and other edges may be broken-line edges, curved edges or the like. For example, in some examples, at least adjacent first edge B1 and second edge B2 are straight edges, and other edges may be broken-line edges, curved edges or the like.

For example, lengths of the first edge B1, the second edge B2, the third edge B3, the fourth edge B4 and the fifth edge B5 are denoted by L1, L2, L3, L4 and L5 in sequence; and $$(L3+L4+L5)^2>(L1)^2+(L2)^2.$$

For example, as shown in FIG. 9, in this example, the first edge B1, the second edge B2, the third edge B3 and the fifth edge B5 are straight edges, and an included angle between two adjacent edges is 90 degrees. The fourth edge B4 is a broken-line edge, and an included angle of a broken-line portion is also 90 degrees.

For example, as shown in FIG. 9, in the direction parallel to the surface of the base substrate 10, the second sub-electrode ES2 includes at least a sixth edge B6, a seventh edge B7, an eighth edge B8, a ninth edge B9 and a tenth edge B10 that are connected end to end in sequence. At least one of the sixth edge B6, the seventh edge B7, the eighth edge B8, the ninth edge B9 and the tenth edge B10 is a straight edge, and other edges may be broken-line edges, curved edges or the like. For example, in some examples, at least adjacent sixth edge B6 and seventh edge B7 are straight edges, and other edges may be broken-line edges, curved edges or the like.

For example, lengths of the sixth edge B6, the seventh edge B7, the eighth edge B8, the ninth edge B9 and the tenth edge B10 are denoted by L6, L7, L8, L9 and L10 in sequence; and $$(L8+L9+L10)^2>(L6)^2+(L7)^2.$$

For example, as shown in FIG. 9, in this example, the sixth edge B6, the seventh edge B7 and the ninth edge B9 are straight edges, and the eighth edge B8 and the tenth edge B10 are broken-line edges. An included angle between two adjacent edges is 90 degrees, and an included angle of a broken-line portion is also 90 degrees.

With the above arrangements, the edges of the first sub-electrode ES1 and the second sub-electrode ES2 are more disordered. Thus, the influence of the diffraction effect of a metal structure on the display effect of the display substrate may be reduced.

In the embodiments of the present disclosure, the display substrate may further include other structures, and details thereof may be known with reference to the related art, which will not be described here redundantly.

For example, in the embodiments of the present disclosure, the base substrate 10 may include a flexible insulating material such as polyimide (PI) and a rigid insulating material such as a glass substrate. For example, in some examples, the base substrate 10 may be of a stacked structure in which a plurality of flexible layers and a plurality of blocking layers are arranged alternately. In this case, the flexible layer may include PI, and the blocking layer may include an inorganic insulating material such as silicon oxide, silicon nitride or silicon oxynitride. For example, the shielding metal layer SL may be made of a metal material such as copper, aluminum or molybdenum, or an alloy material. For example, the buffer layer 15 may be made of an inorganic insulating material such as silicon oxide, silicon nitride or a silicon oxynitride.

For example, the active layer AT may be made of a material such as polycrystalline silicon and metal oxides (e.g., IGZO). A gate electrode insulating layer GI may be made of an inorganic insulating material such as silicon oxide, silicon nitride or a silicon oxynitride. The gate electrode GT may be made of a metal material such as copper, aluminum, titanium and cobalt, for example, may be formed into a single-layer structure or a multi-layer structure, e.g., a multi-layer structure such as titanium/aluminum/titanium or molybdenum/aluminum/molybdenum. The first insulating layer 11 and the pixel defining layer 14 may be made of an organic insulating material such as PI and a resin. The second insulating layer 12 and the inter-layer insulating layer 13 may be made of an inorganic insulating material such as silicon oxide, silicon nitride or a silicon oxynitride. The source electrode layer S and the drain electrode layer D as well as the auxiliary electrode pattern AE may be made of a metal material such as copper, aluminum, titanium and cobalt, for example, may be formed into a single-layer structure or a multi-layer structure, e.g., a multi-layer structure such as titanium/aluminum/titanium or molybdenum/aluminum/molybdenum. The first electrode layer E1, for example, includes a metal oxide such as ITO and IZO, or a metal such as Ag, Al and Mo or an alloy thereof. The material of the light-emitting material layer EL may be an organic light-emitting material. For example, a light-emitting material capable of emitting light of a color (e.g., red light, blue light or green light) may be selected as needed for the material of the light-emitting material layer EL. The second electrode layer E2, for example, includes a metal such as Mg, Ca, Li or Ag or an alloy thereof, or a metal oxide such as IZO and ZTO, or an electrically conductive organic material such as poly(3,4-ethylenedioxythiophene)/poly (styrenesulfonate) (PEDOT/PSS). The embodiments of the present disclosure have no particular limitation on the materials of the functional layers.

At least one embodiment of the present disclosure provides a preparation method of a display substrate. The preparation method includes: providing a base substrate; forming a first metal layer on the base substrate, wherein the first metal layer includes at least one auxiliary electrode pattern; forming a first insulating layer on a side, far away from the base substrate, of the first metal layer, and forming in the first insulating layer at least one first via hole exposing the at least one auxiliary electrode pattern; forming a first electrode layer on a side, far away from the base substrate, of the first insulating layer; forming a light-emitting material on a side form, far away from the base substrate, of the first electrode layer, and forming in the first electrode layer and the light-emitting material layer at least one second via hole exposing the at least one auxiliary electrode pattern and communicated with the at least one first via hole; forming a carbon-containing structural layer in the at least one second via hole; and forming a second electrode on a side form, far away from the base substrate, of the light-emitting material layer, wherein the second electrode layer is electrically connected to the at least one auxiliary electrode pattern through the carbon-containing structural layer. For example, a distance between a surface, close to the base substrate, of the first metal layer near a middle portion of the second via hole and a surface, far away from the base substrate, of the second electrode layer is denoted by d1, and an average carbon-oxygen ratio of the carbon-containing structural layer near the middle portion of the second via hole is denoted by c1; a distance between a surface, close to the base substrate, of the first metal layer near an edge of the second via hole and the surface, far away from the base substrate, of the second electrode layer is denoted by d2, and an average carbon-oxygen ratio of the carbon-containing structural layer near the edge of the second via hole is denoted by c2; and $d1<d2$ and $c1>c2$.

For example, in some embodiments, $c1*d1>c2*d2$. For example, the average carbon-oxygen ratio of the carbon-containing structural layer C is greater than 2:1 and less than 10:1, e.g., 3:1, 5:1 or 8:1. More structures and arrangements of the carbon-containing structural layer C and the display substrate may be known with reference from the above embodiments, which will not be described here redundantly.

The preparation method of the display substrate provided by the embodiments of the present disclosure is described in detail below with reference to FIG. 10A to FIG. 11B.

Figure 10A:
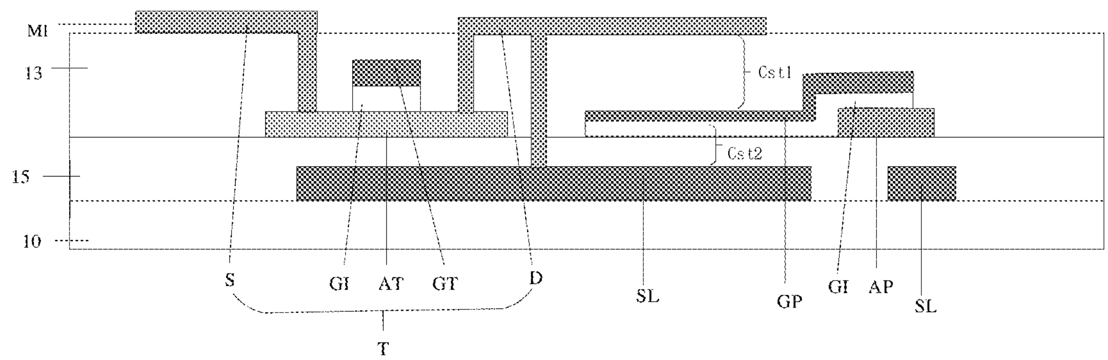
FIG. 10A, FIG. 10B, FIG. 11A and FIG. 11B are cross-sectional schematic diagrams of a display substrate in a preparation process provided by at least one embodiment of the present disclosure.
Figure 10B:
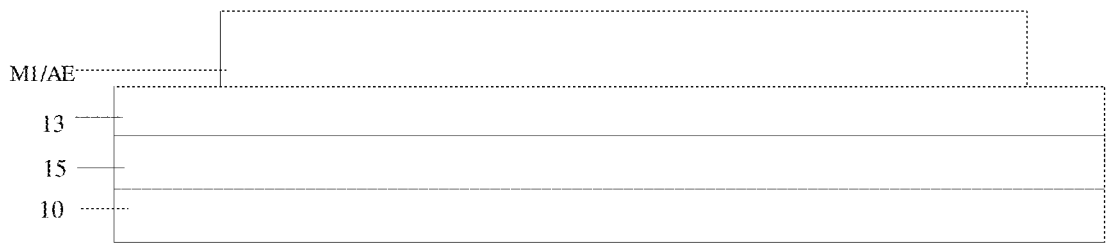

As shown in FIG. 10A and FIG. 10B, a shielding metal material layer is firstly deposited on the base substrate 10 and then subjected to a patterning process to form a shielding metal layer SL. For example, the shielding metal material layer may be made of a metal material such as copper, aluminum or molybdenum, or an alloy material, and a deposition thickness may be 200 nm to 600 nm.

In the embodiments of the present disclosure, a primary patterning process may include processes such as formation of a photoresist, exposure, development and etching.

A buffer layer 15 is then deposited. The buffer layer 15 may be made of a material such as silicon oxide, silicon nitride or a silicon oxynitride, and a deposition thickness may be 300 nm to 500 nm.

Next, an active material layer is deposited and subjected to a patterning process to form an active layer AT. For example, the active material layer may be a material such as polycrystalline silicon and metal oxides (e.g., IGZO), and a deposition thickness may be 30 nm to 50 nm.

Next, a gate electrode insulating material layer and a gate electrode metal layer are deposited, and the gate electrode insulating material layer and the gate electrode metal layer may be patterned by using a self-aligned process to form a gate electrode, a gate electrode metal pattern and a gate electrode insulating layer. For example, the gate electrode insulating material layer and the gate electrode metal layer are subjected to the same patterning process to form the gate electrode, the gate electrode metal pattern and the gate electrode insulating layer, and therefore, the formed gate electrode and gate electrode metal pattern have substantially the same pattern with the gate electrode insulating layer. For example, the gate electrode insulating layer GI may be made of an inorganic insulating material such as silicon oxide, silicon nitride or a silicon oxynitride, and a deposition thickness may be 100 nm to 160 nm. The gate electrode metal layer may be made of a metal material such as copper, aluminum, titanium and cobalt, or an alloy material thereof, for example, may be formed into a single-layer structure or a multi-layer structure, e.g., a molybdenum/aluminum two-layer structure. In this case, a deposition thickness of molybdenum is 30 nm to 60 nm, and a deposition thickness of copper is 300 nm to 500 nm.

Next, an inter-layer insulating material layer is deposited and subjected to a patterning process to form an inter-layer insulating layer 13. The inter-layer insulating layer 13 has a plurality of via holes exposing the active layer AT. For example, the inter-layer insulating layer 13 may be made of an inorganic insulating material such as silicon oxide, silicon nitride or a silicon oxynitride, and a deposition thickness may be 400 nm to 600 nm.

Next, a first metal material layer is deposited and patterned to form a first metal layer M1. The first metal layer M1 includes an auxiliary electrode pattern AE, a source electrode layer S and a drain electrode layer D, and the like. The source electrode layer S and the drain electrode layer D are electrically connected to the active layer AT through the via holes in the inter-layer insulating layer 13. For example, the first metal material layer may be made of a metal material such as copper, aluminum, titanium and cobalt, or an alloy material thereof, for example, may be formed into a single-layer structure or a multi-layer structure, e.g., a MoTi/Cu/MoTi three-layer structure. In this case, a deposition thickness of the MoTi alloy may be 30 nm to 60 nm, and a deposition thickness of copper may be 300 nm to 600 nm. The three-layer structure may reduce the influence of a subsequent laser process on the auxiliary electrode pattern AE, which will be described later.

Figure 11A:
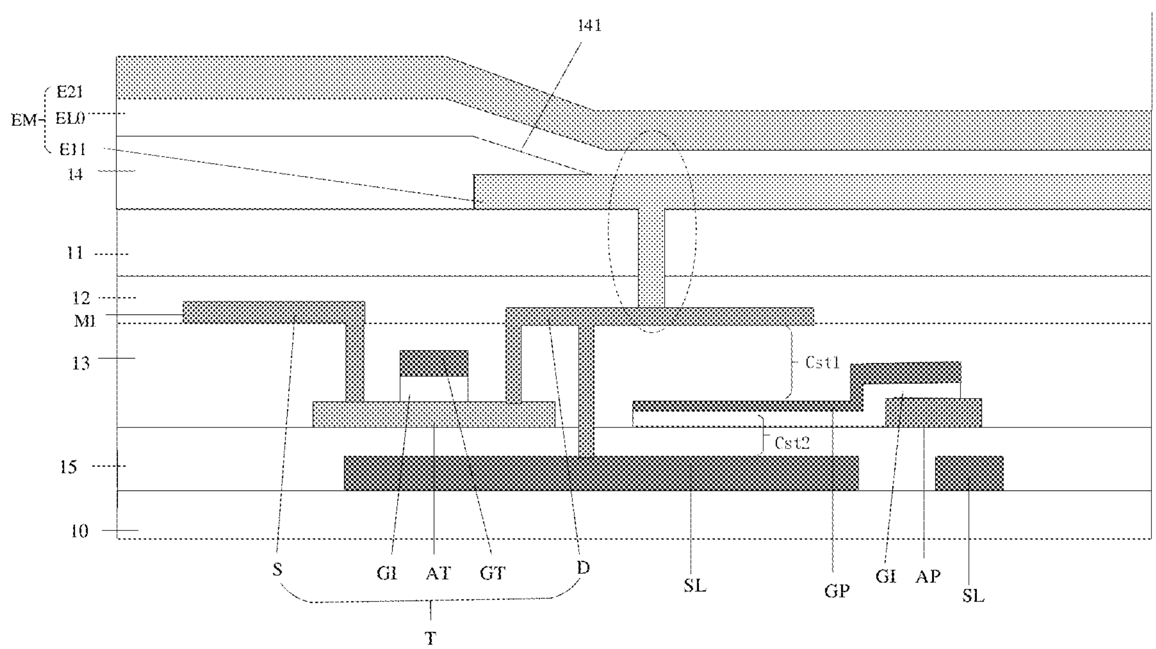
Figure 11B:
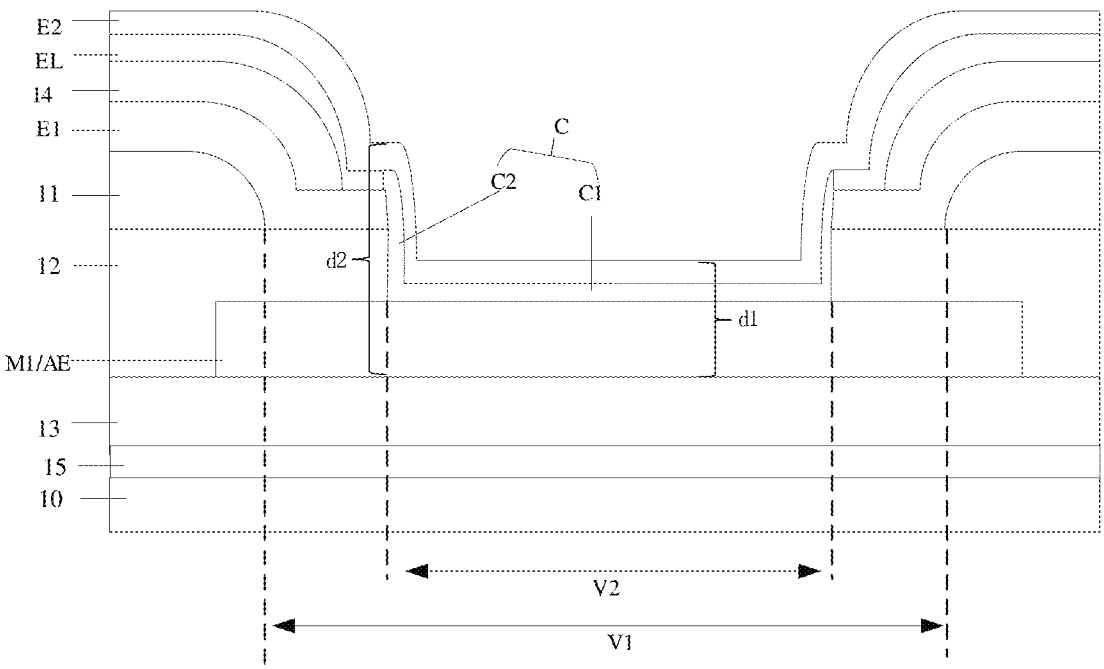

Next, as shown in FIG. 11A and FIG. 11B, a second insulating material layer is deposited and subjected to a patterning process to form a second insulating layer 12. The second insulating layer 12 includes a first sub-via hole exposing the auxiliary electrode pattern AE and a second sub-via hole exposing the drain electrode layer D. The second insulating layer 12 may be used as a passivation layer which may be made of an inorganic insulating material such as silicon oxide, silicon nitride or a silicon oxynitride, and a deposition thickness may be 300 nm to 5000 nm.

Next, a first insulating material layer is deposited and subjected to a patterning process to form a first insulating layer 11. The first insulating layer 11 has a first via hole V1 exposing the auxiliary electrode pattern AE. The first insulating layer 11 may be used as a flat layer which may be made of an organic insulating material such as PI and a resin, and a deposition thickness may be 1000 nm to 3000 nm.

Next, a first electrode material layer is deposited and subjected to a patterning process to form a first electrode layer E1. The first electrode layer E1 includes a first electrode E11, and other portion than the first electrode E11 that has a sub-via hole exposing the auxiliary electrode pattern AE. For example, the first electrode material layer may be made of a metal oxide such as ITO and IZO, or a metal such as Ag, Al and Mo, or an alloy thereof, and a deposition thickness may be 80 nm to 150 nm.

Next, a pixel defining material layer is deposited and subjected to a patterning process to form a pixel defining layer 14. The pixel defining layer 14 has a plurality of sub-pixel openings exposing the first electrode E11 and a sub-via hole exposing the auxiliary electrode pattern AE. For example, the pixel defining material layer may be made of an organic insulating material such as PI and a resin, and a deposition thickness may be 500 nm to 2000 nm.

Next, an organic light-emitting material layer is formed by evaporation and processed by using a laser ablation process to form an organic light-emitting layer EL. The organic light-emitting layer EL includes a sub-via hole exposing the auxiliary electrode pattern AE.

For example, the first sub-via hole of the inter-layer insulating layer 13, the sub-via hole of the first electrode layer E1, the sub-via hole of the pixel defining layer and the sub-via hole of the organic light-emitting layer EL are communicated with one another to form a second via hole V2 exposing the auxiliary electrode pattern AE. For example, a light-emitting material capable of emitting light of a color (e.g., red light, blue light or green light) may be selected as needed for the organic light-emitting material layer, and an evaporation thickness may be 200 nm to 500 nm.

Next, a carbon-containing structural layer C is prepared in the second via hole V2. The carbon-containing structural layer C has a first portion C1 in contact with the auxiliary electrode pattern AE and a second portion C2 located on a sidewall of the second via hole V2. For example, a formation thickness of the carbon-containing structural layer C may be 200 nm to 500 nm.

Next, a second electrode layer E2 is deposited. For example, the second electrode layer E2 may be deposited as an entire surface on the organic light-emitting layer EL. For example, the second electrode layer E2 may be a metal material such as Mg, Ca, Li or Ag, or an alloy material thereof, and a deposition thickness is 30 nm to 150 nm.

Next, other functional layers such as an encapsulation layer EN may also be deposited, and details thereof may be known with reference to the related art, which will not be described redundantly in the embodiments of the present disclosure.

The following points need to be noted:

(1) the accompanying drawings in the embodiments of the present disclosure only involve structures involved in the embodiments of the present disclosure, and other structures may be designed as usual;

(2) for the sake of clarity, the thickness of a layer or a region in the accompanying drawings for describing the embodiments of the present disclosure is scaled up or down. In other words, the drawings are not drawn to actual scale. It will be understood that when a component such as a layer, a film, a region or a substrate is referred to as being located "on" or "below" another component, the component may be "directly" located "on" or "below" another component, or there may be an intermediate component; and (3) the embodiments of the present disclosure and the features in the embodiments can be combined with one another to derive new embodiments without conflict.

The foregoing are merely descriptions of specific embodiments of the present disclosure, but the protection scope of the present disclosure is not limited thereto. The protection scope of the present disclosure is subject to the protection scope of the claims.

What is claimed is:

1. A display substrate, comprising:

a base substrate;

a first metal layer, disposed on the base substrate and comprising at least one auxiliary electrode pattern;

a first insulating layer, disposed on a side, away from the base substrate, of the first metal layer and comprising at least one first via hole exposing a portion of the at least one auxiliary electrode pattern;

a first electrode layer, disposed on a side, away from the base substrate, of the first insulating layer;

a light-emitting material layer, disposed on a side, away from the base substrate, of the first electrode layer, wherein the first electrode layer and the light-emitting material layer comprise at least one second via hole which exposes a portion of the at least one auxiliary electrode pattern and is communicated with the at least one first via hole;

a carbon-containing structural layer, at least partially disposed in the at least one second via hole; and a second electrode layer, disposed on a side, from the base substrate, of the light-emitting material layer and the carbon-containing structural layer, wherein the second electrode layer is electrically connected to the at least one auxiliary electrode pattern through the carbon-containing structural layer;

near a middle portion of the second via hole, a distance between a surface, close to the base substrate, of the first metal layer and a surface, away from the base substrate, of the second electrode layer is denoted by d1, and an average carbon-oxygen ratio of the carbon-containing structural layer is denoted by c1;

near an edge of the second via hole, a distance between a surface, close to the base substrate, of the first metal layer and a surface, away from the base substrate, of the second electrode layer is denoted by d2, and an average carbon-oxygen ratio of the carbon-containing structural layer is denoted by c2; and d1<d2 and c1>c2 wherein;

$$c1*d1>c2*d2.$$

2. The display substrate according to claim 1, wherein $$20*c2*d2>c1*d1>3*c2*d2.$$

3. The display substrate according to claim 1, wherein an area of an orthographic projection of the carbon-containing structural layer on the base substrate is smaller than an area of an orthographic projection of the auxiliary electrode pattern on the base substrate.

4. A display substrate, comprising:

a base substrate;

a first metal layer, disposed on the base substrate and comprising at least one auxiliary electrode pattern;

a first insulating layer, disposed on a side, away from the base substrate, of the first metal layer and comprising at least one first via hole exposing a portion of the at least one auxiliary electrode pattern:

a first electrode layer, disposed on a side, away from the base substrate, of the first insulating layer;

a light-emitting material layer, disposed on a side, away from the base substrate, of the first electrode layer, wherein the first electrode layer and the light-emitting material layer comprise at least one second via hole which exposes a portion of the at least one auxiliary electrode pattern and is communicated with the at least one first via hole;

a carbon-containing structural layer, at least partially disposed in the at least one second via hole; and a second electrode layer, disposed on a side, from the base substrate, of the light-emitting material layer and the carbon-containing structural layer, wherein the second electrode layer is electrically connected to the at least one auxiliary electrode pattern through the carbon-containing structural layer:

near a middle portion of the second via hole, a distance between a surface, close to the base substrate, of the first metal layer and a surface, away from the base substrate, of the second electrode layer is denoted by d1, and an average carbon-oxygen ratio of the carbon-containing structural layer is denoted by c1;

near an edge of the second via hole, a distance between a surface, close to the base substrate, of the first metal layer and a surface, away from the base substrate, of the second electrode layer is denoted by d2, and an average carbon-oxygen ratio of the carbon-containing structural layer is denoted by c2; and d1<d2 and wherein an orthographic projection of the first via hole on the base substrate is located within an orthographic projection of the auxiliary electrode pattern on the base substrate, and an orthographic projection of the second via hole on the base substrate is located within the orthographic projection of the first via hole on the base substrate.

5. The display substrate according to claim 4, wherein the carbon-containing structural layer comprises a first portion in contact with the auxiliary electrode pattern and a second portion located on a sidewall of the second via hole; and an orthographic projection of the first portion on the base substrate is located within the orthographic projection of the second via hole on the base substrate.

6. The display substrate according to claim 5, wherein a contour of an orthographic projection of the first via hole on the auxiliary electrode pattern comprises n inflection points, and a contour of an orthographic projection of the second via hole on the auxiliary electrode pattern comprises m inflection points; and m>n>0.

7. The display substrate according to claim 4, wherein the carbon-containing structural layer has an orthographic projection, with an area denoted by S1, on the base substrate, and has an average carbon-oxygen ratio denoted by Cs1;

the light-emitting material layer in a region, where the carbon-containing structural layer is not located, of the first via hole has an orthographic projection, with an area denoted by S2, on the base substrate, and has an average carbon-oxygen ratio denoted by Cs2; and a carbon-oxygen matching coefficient k is derived as follows:

$$k=S2*Cs2/S1*Cs1,\ 0<k<2/3.$$

8. A display substrate, comprising:

a base substrate;

a first metal layer, disposed on the base substrate and comprising at least one auxiliary electrode pattern;

a first insulating layer, disposed on a side, away from the base substrate, of the first metal layer and comprising at least one first via hole exposing a portion of the at least one auxiliary electrode pattern;

a first electrode layer, disposed on a side, away from the base substrate, of the first insulating layer;

a light-emitting material layer, disposed on a side, away from the base substrate, of the first electrode layer, wherein the first electrode layer and the light-emitting material layer comprise at least one second via hole which exposes a portion of the at least one auxiliary electrode pattern and is communicated with the at least one first via hole;

a carbon-containing structural layer, at least partially disposed in the at least one second via hole; and a second electrode layer, disposed on a side, from the base substrate, of the light-emitting material layer and the carbon-containing structural layer, wherein the second electrode layer is electrically connected to the at least one auxiliary electrode pattern through the carbon-containing structural layer;

near a middle portion of the second via hole, a distance between a surface, close to the base substrate, of the first metal layer and a surface, away from the base substrate, of the second electrode layer is denoted by d1, and an average carbon-oxygen ratio of the carbon-containing structural layer is denoted by c1;

near an edge of the second via hole, a distance between a surface, close to the base substrate, of the first metal layer and a surface, away from the base substrate, of the second electrode layer is denoted by d2, and an average carbon-oxygen ratio of the carbon-containing structural layer is denoted by c2; and d1<d2 and c1>c2; wherein the auxiliary electrode pattern comprises a first slope portion at the edge of the second via hole, and the inter-layer insulating layer comprises a second slope portion at the edge of the second via hole; and a length of the first slope portion is less than a length of the second slope portion.

9. The display substrate according to claim 8, further comprising a pixel driving circuit, wherein the pixel driving circuit comprises a transistor and a storage capacitor; the transistor comprises an active layer disposed on the base substrate, a gate electrode disposed on a side, away from the base substrate, of the active layer, and a source electrode layer and a drain electrode layer disposed on a side, away from the base substrate, of the gate electrode; the source electrode layer and the drain electrode layer are each electrically connected to the active layer; the storage capacitor comprises a first plate and a second plate;

at least a part of the source electrode layer, the drain electrode layer and the second plate is in the first metal layer; and the second insulating layer is disposed on a side, away from the base substrate, of the source electrode layer and the drain electrode layer.

10. The display substrate according to claim 9, further comprising:

a shielding metal layer disposed between the base substrate and the active layer, and a gate electrode metal pattern disposed in a same layer with the gate electrode, wherein an orthographic projection of the gate electrode metal pattern on the base substrate is at least overlapped with an orthographic projection of the shielding metal layer on the base substrate and is at least overlapped with an orthographic projection of the source electrode layer or the drain electrode layer on the base substrate to form the storage capacitor.

11. The display substrate according to claim 10, further comprising a buffer layer disposed between the shielding metal layer and the active layer, wherein a maximum distance between a surface, away from the base substrate, of the auxiliary electrode pattern and a surface, away from the base substrate, of the buffer layer is greater than a maximum distance between the surface, away from the base substrate, of the buffer layer and a surface, away from the base substrate, of the source electrode layer and the drain electrode layer.

12. The display substrate according to claim 9, wherein the second insulating layer has a first sub-via hole exposing the auxiliary electrode pattern and a second sub-via hole exposing the source electrode layer or the drain electrode layer;

the second insulating layer has a third slope portion at the first sub-via hole and a fourth slope portion at the second sub-via hole; and a slope angle of the third slope portion is greater than a slope angle of the fourth slope portion.

13. The display substrate according to claim 12, further comprising a light-emitting pixel column and a transparent pixel column arranged alternately, wherein the light-emitting pixel column comprises a plurality of light-emitting pixel units, and each of the plurality of light-emitting pixel units comprises a plurality of light-emitting sub-pixels;

the transparent pixel column comprises a plurality of transparent pixel units, which are defined by a gate electrode line and a boundary of the light-emitting pixel column, and each of the plurality of transparent pixel units comprises a transparent sub-pixel; and the plurality of transparent pixel units and the plurality of light-emitting pixel units are arranged in a staggered manner in a column direction.

14. The display substrate according to claim 13, wherein each of the plurality of light-emitting pixel units comprises four sub-pixels comprising one red sub-pixel, one green sub-pixel, one blue sub-pixel and one white sub-pixel; the red sub-pixel and the blue sub-pixel are located in a same row, and the green sub-pixel and the white sub-pixel are located in a same row; and a sum of areas of light-emitting regions of the red sub-pixel and the blue sub-pixel is greater than a sum of areas of light-emitting regions of the green sub-pixel and the white sub-pixel.

15. The display substrate according to claim 14, wherein the red sub-pixel and the white sub-pixel are located in a same column, and the green sub-pixel and the blue sub-pixel are located in a same column; and a sum of areas of light-emitting regions of the red sub-pixel and the white sub-pixel is greater than a sum of areas of light-emitting regions of the green sub-pixel and the blue sub-pixel.

16. The display substrate according to claim 14, wherein the auxiliary electrode pattern is disposed in the row in which the red sub-pixel and the blue sub-pixel are located.

17. The display substrate according to claim 13, wherein each of the plurality of light-emitting sub-pixels comprises a light-emitting element, and the light-emitting element comprises a first electrode located in the first electrode layer, a light-emitting layer located in the light-emitting material layer, and a second electrode located in the second electrode layer;

the first electrode comprises a first sub-electrode and a second sub-electrode that are electrically connected through a conductive structure;

the conductive structure is electrically connected to the source electrode layer or the drain electrode layer through the second sub-via hole; and in a direction parallel to a surface of the base substrate, the second sub-via hole is located between the first sub-electrode and the second sub-electrode.

18. The display substrate according to claim 17, wherein in the direction parallel to the surface of the base substrate, the first sub-electrode comprises at least a first edge, a second edge, a third edge, a fourth edge and a fifth edge that are connected end to end in sequence; and at least one of the first edge, the second edge, the third edge, the fourth edge and the fifth edge is a straight edge;

lengths of the first edge, the second edge, the third edge, the fourth edge and the fifth edge are denoted by L1, L2, L3, L4 and L5 in sequence; and $(L3+L4+L5)^2>(L1)^2+(L2)^2$.

19. The display substrate according to claim 18, wherein in the direction parallel to the surface of the base substrate, the second sub-electrode comprises at least a sixth edge, a seventh edge, an eighth edge, a ninth edge and a tenth edge that are connected end to end in sequence; and at least one of the sixth edge, the seventh edge, the eighth edge, the ninth edge and the tenth edge is a straight edge;

lengths of the sixth edge, the seventh edge, the eighth edge, the ninth edge and the tenth edge are denoted by L6, L7, L8, L9 and L10 in sequence; and $(L8+L9+L10)^2>(L6)^2+(L7)^2$.

* * * * *